(12) United States Patent
Kawashima

(10) Patent No.: US 7,564,326 B2
(45) Date of Patent: Jul. 21, 2009

(54) ELECTRONIC APPARATUS AND MANUFACTURING METHOD OF THE SAME

(75) Inventor: Hirofumi Kawashima, Tokyo (JP)

(73) Assignee: Piedek Technical Laboratory (JP)

( * ) Notice: Subject to any disclaimer, the term of this patent is extended or adjusted under 35 U.S.C. 154(b) by 0 days.

(21) Appl. No.: 11/821,753

(22) Filed: Jun. 25, 2007

(65) Prior Publication Data

US 2007/0257741 A1    Nov. 8, 2007

Related U.S. Application Data

(60) Continuation of application No. 11/398,876, filed on Apr. 6, 2006, now abandoned, which is a division of application No. 10/749,182, filed on Dec. 30, 2003, now Pat. No. 7,071,794, which is a continuation-in-part of application No. 10/378,719, filed on Mar. 4, 2003, now abandoned.

(30) Foreign Application Priority Data

Mar. 6, 2002    (JP) .............................. 2002-060827

(51) Int. Cl.
*H03H 9/215*    (2006.01)
*H03H 3/02*    (2006.01)
*H01L 41/04*    (2006.01)
*H01L 41/053*    (2006.01)
*H03B 5/32*    (2006.01)

(52) U.S. Cl. .................. 333/200; 29/25.35; 29/593; 29/594; 29/832; 310/370; 331/107 A; 331/156

(58) Field of Classification Search ................ 333/186, 333/187, 200; 29/25.35, 593–595, 609.1, 29/830, 831, 834, 835, 896.22, 854, 25.41; 310/370, 319; 216/13, 80, 97; 331/107 A, 331/156

See application file for complete search history.

(56) References Cited

U.S. PATENT DOCUMENTS

| | | | |
|---|---|---|---|
| 4,178,566 A * | 12/1979 | Kawashima | ................ 331/156 |
| 6,541,897 B2 * | 4/2003 | Endoh | ........................ 310/344 |
| 6,587,009 B2 * | 7/2003 | Kitamura et al. | ............ 331/158 |
| 6,894,428 B2 * | 5/2005 | Tanaya et al. | ................ 310/370 |
| 6,898,832 B2 * | 5/2005 | Kawashima | ................ 29/25.35 |
| 6,915,548 B2 * | 7/2005 | Kawashima | ................ 29/25.35 |
| 6,959,472 B2 * | 11/2005 | Kawashima | ................ 29/25.35 |
| 7,071,794 B2 * | 7/2006 | Kawashima | ................ 333/187 |

* cited by examiner

*Primary Examiner*—Barbara Summons
(74) *Attorney, Agent, or Firm*—Adams & Wilks

(57) ABSTRACT

An electronic apparatus comprises at least one quartz crystal oscillator comprised of a quartz crystal oscillating circuit having a quartz crystal resonator, an amplifier, at least one resistor, and capacitors. The quartz crystal resonator comprises a quartz crystal tuning fork resonator having a quartz crystal tuning fork base, quartz crystal tuning fork tines connected to the quartz crystal tuning fork base, and at least one groove formed in at least one of opposite main surfaces of the quartz crystal tuning fork tines. A length of the at least one groove formed in at least one of the opposite main surfaces of the quartz crystal tuning fork tines is within a range of 40% to 80% of a length of the quartz crystal tuning fork tines.

31 Claims, 13 Drawing Sheets

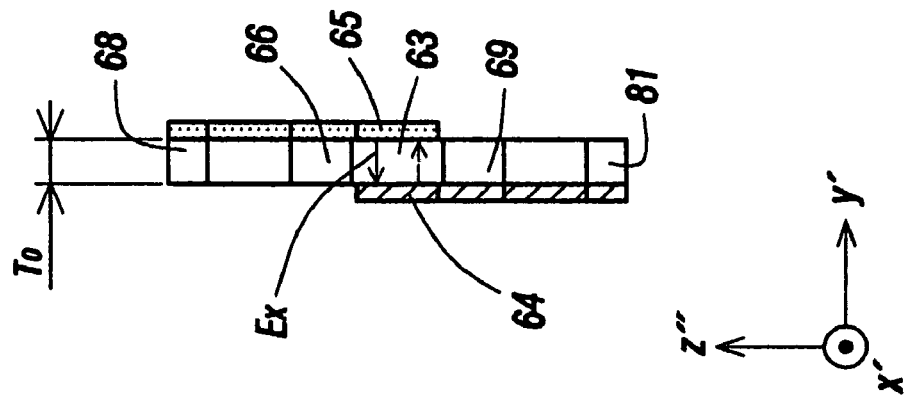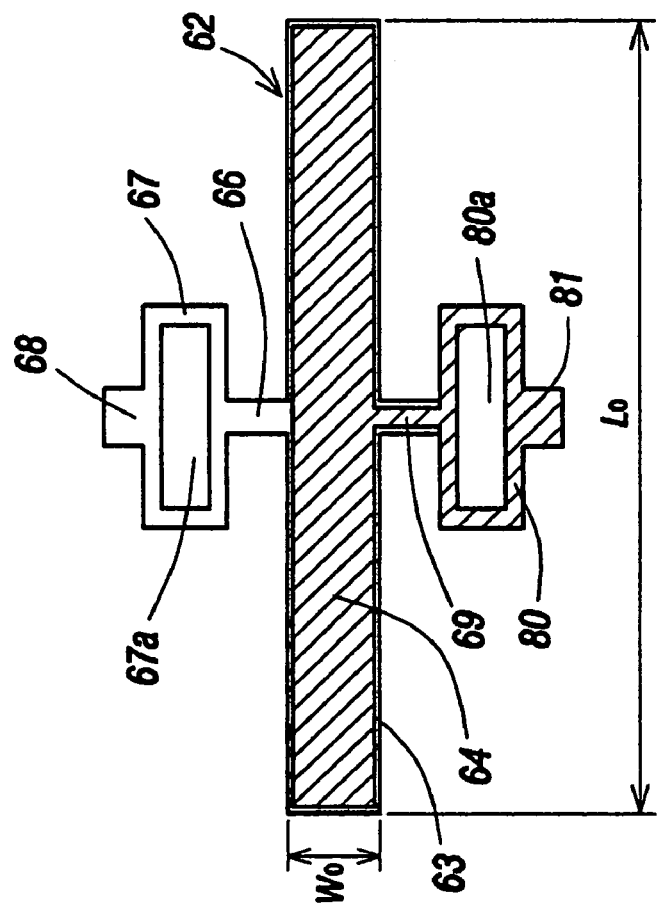

ELECTRONIC APPARATUS AND MANUFACTURING METHOD OF THE SAME

CROSS-REFERENCE TO RELATED APPLICATIONS

This application is a continuation of U.S. patent application Ser. No. 11/398,876, filed Apr. 6, 2006, now abandoned, which is a division of U.S. patent application Ser. No. 10/749,182, filed Dec. 30, 2003, now U.S. Pat. No. 7,071,794, which is a continuation-in-part of U.S. patent application Ser. No. 10/378,719, filed Mar. 4, 2003, now abandoned.

FIELD OF THE INVENTION

The present invention relates to an electronic apparatus having a display portion and a quartz crystal oscillator, and a method for manufacturing the electronic apparatus.

BACKGROUND OF THE INVENTION

There are many electronic apparatuses comprising at least a display portion and a quartz crystal oscillator. For example, cellular phones, wristwatches, facsimiles and pagers comprising a quartz crystal oscillator are well known. Recently, because of high stability for frequency, miniaturization and the light weight nature of these electronic apparatuses, the need for an electronic apparatus comprising a smaller quartz crystal oscillator with a high frequency stability has arisen. For example, the quartz crystal oscillator with a quartz crystal tuning fork resonator, which is capable of vibrating in a flexural mode, is widely used as a time standard in an electronic apparatus such as cellular phones, wristwatches, facsimiles and pagers. Similar to this, the same need has also arisen for an electronic apparatus comprising a length-extensional mode quartz crystal resonator with a frequency of 1 MHz to 10 MHz to decrease an electric current consumption of the electronic apparatus.

Heretofore, however, it has been impossible to obtain an electronic apparatus having a smaller quartz crystal oscillator with a conventional miniaturized quartz crystal tuning fork resonator, capable of vibrating in a flexural mode, and having a high frequency stability, a small series resistance and a high quality factor. When miniaturized, the conventional quartz crystal tuning fork resonator, capable of vibrating in a flexural mode, as shown in FIG. 12 (which has electrodes on the obverse faces 203, 207, reverse faces 204, 208 and the four sides 205, 206, 209, 210 of each tuning fork tine, as also shown in FIG. 13—a cross-sectional view of tuning fork tines of FIG. 12) has a smaller electromechanical transformation efficiency because the resonator shape and the electrode construction provide a small electric field (i.e., Ex becomes small), as a result of which the resonator has a low frequency stability, a large series resistance and a reduced quality factor. In FIG. 12, a conventional tuning fork resonator 200 is shown with tines 201, 202 and a base 230.

Moreover, for example, Japanese Patent Nos. P56-65517 and P2000-223992A and International Patent No. WO 00/44092 were published and teach grooves and electrodes constructed at tuning fork tines of a flexural mode, tuning fork, quartz crystal resonator. However, they teach nothing about a quartz crystal oscillator of the present invention having novel shape, novel electrode construction and figure of merit M for a quartz crystal tuning fork resonator, capable of vibrating in a flexural mode and about a relationship of an amplification circuit and a feedback circuit which construct a quartz crystal oscillating circuit.

Additionally, for example, there has been a big problem in the conventional oscillator with the conventional quartz crystal tuning fork resonator, such that a fundamental mode vibration of the resonator jumps to a second overtone mode vibration by shock or vibration.

Similarly, however, it has been impossible to obtain an electronic apparatus comprising a smaller quartz crystal oscillator with a conventional length-extensional mode quartz crystal resonator, capable of vibrating in a length-extensional mode, and having a frequency of 1 MHz to 10 MHz, a small series resistance and a high quality factor. As an example of a length-extensional mode quartz crystal resonator of the prior art, the length-extensional mode resonator comprising a vibrational portion, connecting portions and supporting portions, which is formed from a Z plate perpendicular to z axis, is well known, and this resonator is formed integrally by a chemical etching process. Also, electrodes are disposed opposite each other on sides of the vibrational portion formed by the chemical etching process so that the electrodes disposed opposite each other are of opposite electrical polarity.

Also, a cutting angle of the conventional length-extensional mode quartz crystal resonator is generally within a range of ZYw(0° to +5°), according to an IEEE notation. In detail, the connecting portions are connected opposite each other at both end portions of a width of the vibrational portion and at a central portion of the length direction thereof. Namely, the direction of the connecting portions constructed opposite each other corresponds to the direction of the electric field.

When an alternating current (AC) voltage is applied between the electrodes, an electric field occurs alternately in the width direction, as a result, the resonator is capable of vibrating in the length direction, but the electric field of between the electrodes becomes very small because quartz crystal is an anisotropic material and the sides of the vibrational portion have a complicated shape formed by the chemical etching process. Namely, the resonator has small electromechanical transformation efficiency because the resonator's shape and the electrode construction provide a small electric field, consequently, the resonator has a low frequency stability, a large series resistance and a reduced quality factor when it has the frequency of 1 MHz to 10 MHz.

It is, therefore, a general object of the present invention to provide embodiments of an electronic apparatus and a quartz crystal oscillator, which constructs an electronic apparatus of the present invention, comprising a quartz crystal oscillating circuit with a flexural mode, quartz crystal tuning fork resonator, capable of vibrating in a fundamental mode, and having a high frequency stability, a small series resistance and a high quality factor, or embodiments of a quartz crystal oscillator, which also constructs an electronic apparatus of the present invention, comprising a quartz crystal oscillating circuit with a length-extensional mode quartz crystal resonator having a frequency of 1 MHz to 10 MHz, a small series resistance and a high quality factor, which overcome or at least mitigate one or more of the above problems.

SUMMARY OF THE INVENTION

The present invention relates to an electronic apparatus comprising a display portion and a quartz crystal oscillator at least, and the quartz crystal oscillator comprises a quartz crystal oscillating circuit having an amplification circuit and a feedback circuit, and in particular, relates to a quartz crystal oscillator having a flexural mode, quartz crystal tuning fork resonator capable of vibrating in a fundamental mode and having an output signal of a high frequency stability for the fundamental mode vibration of the resonator, and also to a quartz crystal oscillator having a suppressed second overtone mode vibration of the flexural mode, quartz crystal tuning fork resonator, in addition, relates to a quartz crystal oscillator comprising a length-extensional mode quartz crystal resonator. The quartz crystal oscillators are, therefore, available for the electronic apparatus requiring miniaturized and low priced quartz crystal oscillators with high time accuracy and shock proof.

It is an object of the present invention to provide an electronic apparatus comprising a quartz crystal oscillator with a miniature quartz crystal tuning fork resonator, capable of vibrating in a flexural mode, and having a high frequency stability, a small series resistance $R_1$ and a high quality factor $Q_1$, whose nominal frequency for a fundamental mode vibration is within a range of 10 kHz to 200 kHz.

It is an another object of the present invention to provide an electronic apparatus comprising a quartz crystal oscillator with a flexural mode, quartz crystal tuning fork resonator, capable of vibrating in a fundamental mode, and having a high frequency stability which gives a high time accuracy.

It is a further object of the present invention to provide an electronic apparatus comprising a quartz crystal oscillator with a length-extensional mode quartz crystal resonator.

According to one aspect of the present invention, there is provided an electronic apparatus comprising a display portion and a quartz crystal oscillator at least, and said electronic apparatus having one quartz crystal oscillator, said one quartz crystal oscillator comprising: a quartz crystal oscillating circuit comprising; an amplification circuit comprising an amplifier at least and a feedback circuit comprising a quartz crystal resonator and capacitors at least, said quartz crystal resonator being a quartz crystal tuning fork resonator, capable of vibrating in a flexural mode, and said quartz crystal tuning fork resonator comprising: tuning fork tines each of which has a length, a width and a thickness and the length greater than the width and the thickness; and a tuning fork base; said tuning fork tines and said tuning fork base that are formed integrally; and electrodes disposed facing each other on sides of said tuning fork tines so that the electrodes disposed facing each other are of opposite electrical polarity and said tuning fork tines are capable of vibrating in inverse phase, According to a second aspect of the present invention there is provided an electronic apparatus comprising a display portion and a quartz crystal oscillator at least, and said electronic apparatus comprises at least one quartz crystal oscillator comprising: an oscillating circuit comprising; an amplification circuit comprising an amplifier at least, and a feedback circuit comprising a length-extensional mode quartz crystal resonator which is one of a contour mode quartz crystal resonator.

According to a third aspect of the present invention, there is provided a method for manufacturing an electronic apparatus comprising a display portion and a quartz crystal oscillator at least, and said electronic apparatus comprising at least one quartz crystal oscillator, said at least one oscillator comprising: a quartz crystal oscillating circuit comprising; an amplification circuit comprising an amplifier at least, and a feedback circuit comprising a quartz crystal resonator and capacitors at least, said quartz crystal resonator being a quartz crystal tuning fork resonator, capable of vibrating in a flexural mode, said quartz crystal tuning fork resonator comprising the steps of: forming integrally tuning fork tines each of which has a length, a width and a thickness and the length greater than the width and the thickness and a tuning fork base; disposing electrodes facing each other on sides of said tuning fork tines so that the electrodes disposed facing each other are of opposite electrical polarity and said tuning fork tines vibrate an in inverse phase; and adjusting resonance frequency of said quartz crystal tuning fork resonator after mounting it at a mounting portion by conductive adhesives or solder so that a frequency deviation is within a range of −100 PPM to +100 PPM.

According to a fourth aspect of the present invention, there are provided a quartz crystal resonator, a quartz crystal unit and a quartz crystal oscillator, each of which has a piezoelectric constant $e_{12}$ that is within a range of 0.095 C/m² to 0.19 C/m².

Preferably, said tuning fork resonator is constructed so that figure of merit $M_1$ of a fundamental mode vibration is larger than figure of merit $M_2$ of a second overtone mode vibration.

Preferably, the quartz crystal oscillator with said tuning fork resonator is constructed so that a ratio of an amplification rate $\alpha_1$ of the fundamental mode vibration and an amplification rate $\alpha_2$ of the second overtone mode vibration of said amplification circuit is larger than that of a feedback rate $\beta_2$ of the second overtone mode vibration and a feedback rate $\beta_1$ of the fundamental mode vibration of said feedback circuit, and a product of the amplification rate $\alpha_1$ and the feedback rate $\beta_1$ of the fundamental mode vibration is larger than 1.

Preferably, the quartz crystal oscillator with said tuning fork resonator is constructed so that a ratio of an absolute value of negative resistance, $|-RL_1|$ of the fundamental mode vibration of said amplification circuit and series resistance $R_1$ of the fundamental mode vibration is larger than that of an absolute value of negative resistance, $|-RL_2|$ of the second overtone mode vibration of said amplification circuit and series resistance $R_2$ of the second overtone mode vibration.

Preferably, the length-extensional mode quartz crystal resonator comprises a vibrational portion, connecting portions and supporting portions, which are formed integrally by a particle method.

The present invention will be more fully understood by referring to the following detailed specification and claims taken in connection with the appended drawings.

BRIEF DESCRIPTION OF THE DRAWINGS

FIG. 8a and FIG. 8b show a top view and a side view of a length-extensional mode quartz crystal resonator constructing a quartz crystal oscillator, which constructs an electronic apparatus of the third embodiment of the present invention;

DETAILED DESCRIPTION

Figure 1:
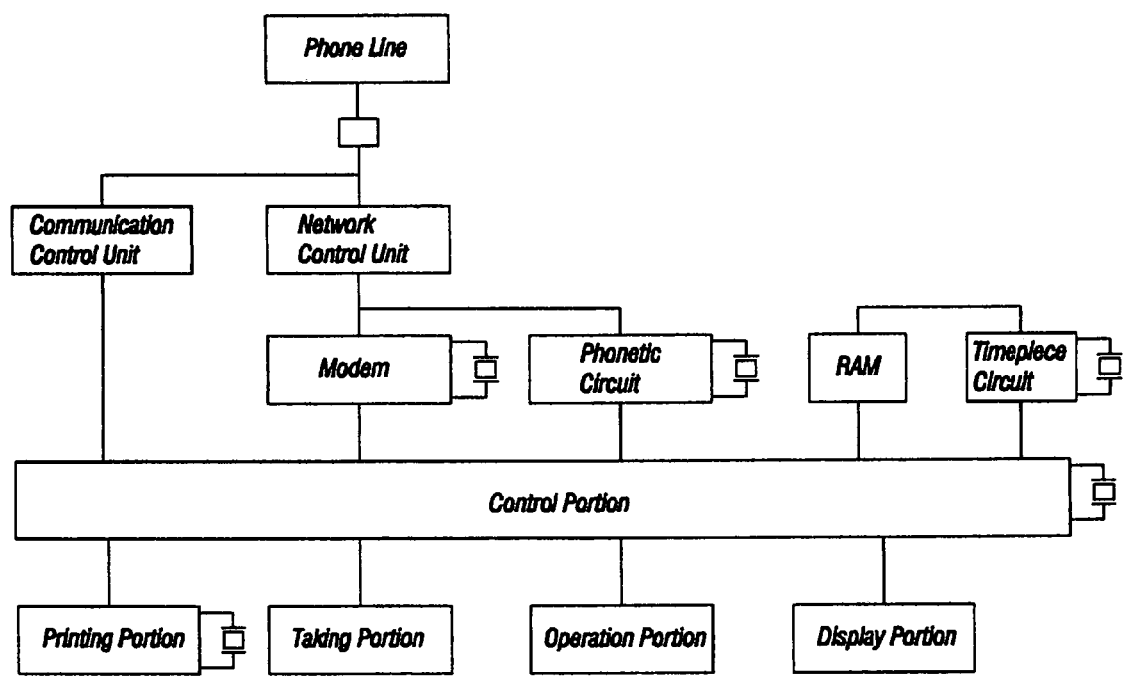
FIG. 1 shows a block diagram of an embodiment of an electronic apparatus of the present invention, and illustrating the diagram of a facsimile apparatus.

Referring now to the drawings, the embodiments of the present invention will be described in more detail.

FIG. 1 shows a block diagram of an embodiment of an electronic apparatus of the present invention, and illustrating the diagram of a facsimile apparatus. As is shown in FIG. 1, the apparatus generally comprises a modem, a phonetic circuit, a timepiece circuit, a printing portion, a taking portion, an operation portion and a display portion. In this principle, perception and scanning of reflection light of light projected on manuscript in the taking portion are performed by CCD (Charge Coupled Device), in addition, light and shade of the reflection light are transformed into a digital signal, and the signal is modulated by the modem and is sent to a phone line (Communication line). Also, in a receiving side, a received signal is demodulated by the modem and is printed on a paper in the print portion by synchronizing the received signal with a signal of a sending side.

As shown in FIG. 1, a quartz crystal resonator is used as a CPU clock of the control portion and the printing portion, as a clock of the phonetic circuit and the modem, and as a time standard of the timepiece. Namely, the resonator constructs a quartz crystal oscillator and an output signal of the oscillator is used. For example, it is used as a signal to display time at the display portion. In this case, a quartz crystal tuning fork resonator, capable of vibrating in a flexural mode is used, and e.g. as the CPU clock, a contour mode quartz crystal resonator such as a length-extensional mode quartz crystal resonator or a thickness shear mode quartz crystal resonator is used. In order to get the facsimile apparatus of this embodiment which operates normally, an accuracy output signal of the oscillator is required for the facsimile apparatus, which is one of the electronic apparatus of the present invention. Also, a digital display and an analogue display are included in the display of the present invention.

In this embodiment, though the facsimile apparatus is shown as an example of an electronic apparatus, the present invention is not limited to this, namely, the present invention includes all electronic apparatus, each of which comprises a quartz crystal oscillator and a display portion at least, for example, cellar phones, telephones, a TV set, cameras, a video set, video cameras, pagers, personal computers, printers, CD players, MD players, electronic musical instruments, car navigators, car electronics, timepieces, IC cards and so forth.

Figure 2:
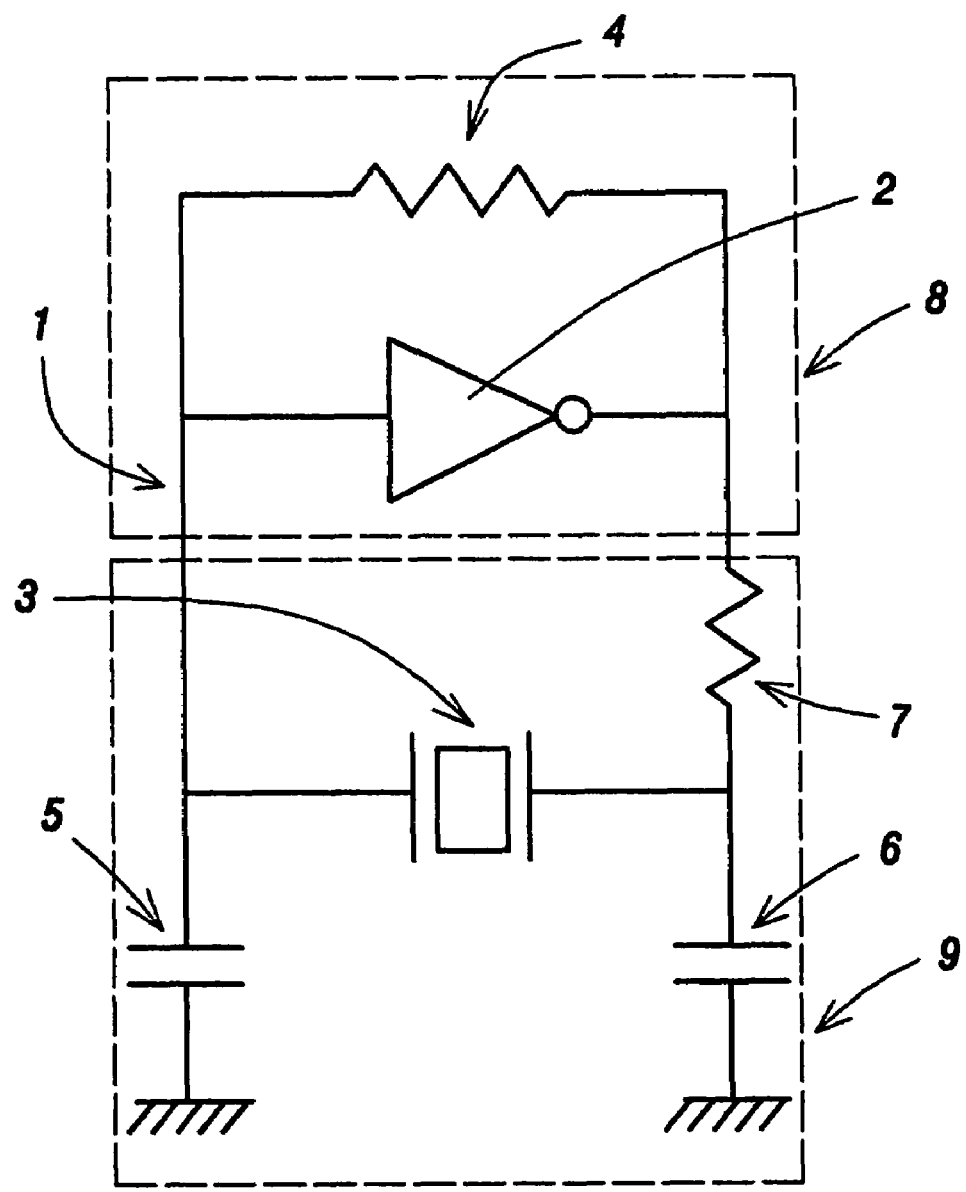
FIG. 2 shows a diagram of an embodiment of a quartz crystal oscillating circuit constructing a quartz crystal oscillator, which constructs an electronic apparatus of the present invention.

FIG. 2 shows a diagram of an embodiment of a quartz crystal oscillating circuit constructing a quartz crystal oscillator, which constructs an electronic apparatus of the present invention. The quartz crystal oscillating circuit 1 comprises an amplifier (CMOS Inverter) 2, a feedback resistor 4, a drain resistor 7, capacitors 5, 6 and a flexural mode, quartz crystal tuning fork resonator 3. Namely, the oscillating circuit 1 comprises an amplification circuit 8 having the amplifier 2 and the feedback resistor 4, and a feedback circuit 9 having the drain resistor 7, the capacitors 5, 6 and the quartz crystal tuning fork resonator 3. In addition, an output signal of the oscillating circuit 1 comprising the quartz crystal tuning fork resonator 3, capable of vibrating in a fundamental mode, is outputted through a buffer circuit (not shown in FIG. 2).

In detail, an oscillation frequency of the fundamental mode vibration is outputted through a buffer circuit as an output signal. According to the present invention, a nominal frequency of the fundamental mode vibration of the resonator is within a range of 10 kHz to 200 kHz. Especially, 32.768 kHz is an important frequency. In general, the output signal has an oscillation frequency which is within a range of −100 PPM to +100 PPM to the nominal frequency, e.g. 32.768 kHz. In more detail, the quartz crystal oscillator in this embodiment comprises a quartz crystal oscillating circuit and a buffer circuit, namely, the quartz crystal oscillating circuit comprises an amplification circuit and a feedback circuit, and the amplification circuit comprises an amplifier and a feedback resistor, and the feedback circuit comprises a flexural mode, quartz crystal tuning fork resonator, a drain resistor and capacitors. Also, flexural mode, quartz crystal tuning fork resonators which are used in a quartz crystal oscillator will be described in FIG. 4-FIG. 7 in detail. Instead of the flexural mode, quartz crystal tuning fork resonator, a contour mode resonator such as a length-extensional mode quartz crystal resonator, a width-extensional mode quartz crystal resonator and a Lame mode quartz crystal resonator or a thickness shear mode quartz crystal resonator may be used.

Figure 3:
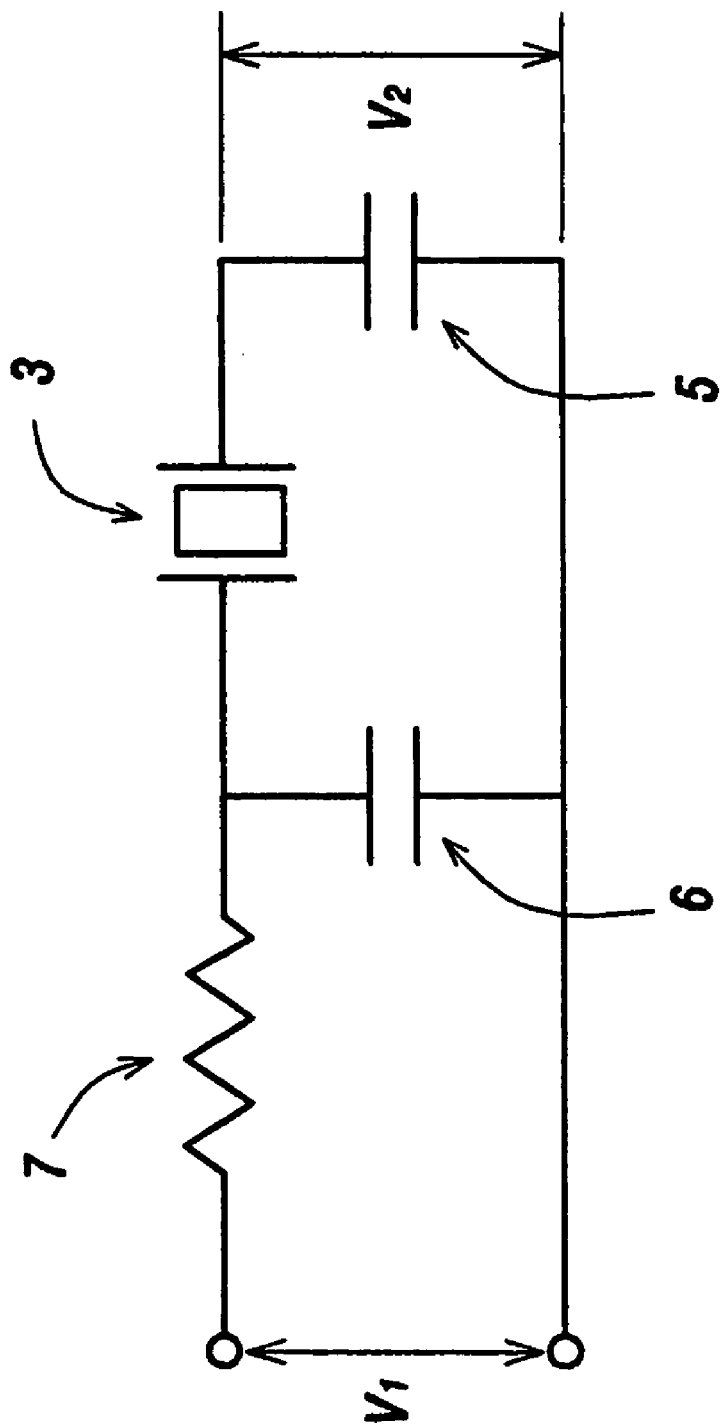
FIG. 3 shows a diagram of the feedback circuit of FIG. 2.

FIG. 3 shows a diagram of the feedback circuit of FIG. 2. Now, when angular frequency $\omega_i$ of the flexural mode, quartz crystal tuning fork resonator 3, capable of vibrating in a flexural mode, a resistance $R_d$ of the drain resistor 7, capacitance $C_g$, $C_d$ of the capacitors 5, 6, crystal impedance $R_{ei}$ of the quartz crystal resonator 3, an input voltage $V_1$, and an output voltage $V_2$ are taken, a feedback rate $\beta_i$ is defined by $\beta_i = |V_2|_i / |V_1|_i$, where i shows vibration order, for example, when i=1 and 2, they are for a fundamental mode vibration and a second overtone mode vibration.

In addition, load capacitance $C_L$ is given by $C_L = C_g C_d/(C_g + C_d)$, and when $C_g = C_d = C_{gd}$ and $Rd >> R_{ei}$, the feedback rate $\beta_i$ is given by $\beta_i = 1/(1 + kC_L^2)$, where k is expressed by a function of $\omega_i$, $R_d$ and $R_{ei}$. Also, $R_{ei}$ is approximately equal to series resistance $R_i$.

Thus, it is easily understood from a relationship of the feedback rate $\beta_i$ and load capacitance $C_L$ that the feedback rate of resonance frequency for a fundamental mode vibration and an overtone mode vibration becomes large, respectively, according to decrease of load capacitance $C_L$. Therefore, when $C_L$ has a small value, an oscillation of the overtone mode occurs very easily, instead of that of the fundamental mode. This is the reason why a maximum amplitude of the overtone mode vibration becomes smaller than that of the fundamental mode vibration, and the oscillation of the overtone mode satisfies an amplitude condition and a phase condition simultaneously which are the continuous condition of an oscillation in an oscillating circuit.

As it is also one object of the present invention to provide a quartz crystal oscillator having a flexural mode, quartz crystal tuning fork resonator, capable of vibrating in a fundamental mode and having a high frequency stability (high time accuracy) of an output signal, and having reduced electric current consumption, in this embodiment, load capacitance $C_L$ is less than 25 pF to reduce electric current consumption. To get much reduced electric current consumption, $C_L$ is preferably less than 15 pF because electric current consumption is proportional to $C_L$.

In addition, in order to suppress a second overtone mode vibration and to obtain a quartz crystal oscillator having an output signal of an oscillation frequency of a fundamental mode vibration, the quartz crystal oscillator in this embodiment is constructed so that it satisfies a relationship of $\alpha_1/\alpha_2 > \beta_2/\beta_1$ and $\alpha_1\beta_1 > 1$, where $\alpha_1$ and $\alpha_2$ are, respectively, an amplification rate of the fundamental mode vibration and the second overtone mode vibration of an amplification circuit, and $\beta_1$ and $\beta_2$ are, respectively, a feedback rate of the fundamental mode vibration and the second overtone mode vibration of a feedback circuit.

In other words, the quartz crystal oscillator is constructed so that a ratio of the amplification rate $\alpha_1$ of the fundamental mode vibration and the amplification rate $\alpha_2$ of the second overtone mode vibration of the amplification circuit is larger than that of the feedback rate $\beta_2$ of the second overtone mode vibration and the feedback rate $\beta_1$ of the fundamental mode vibration of the feedback circuit, and also a product of the amplification rate $\alpha_1$ and the feedback rate $\beta_1$ of the fundamental mode vibration is larger than 1. A description of the high frequency stability will be performed later.

Also, characteristics of the amplifier of the amplification circuit constructing the quartz crystal oscillating circuit of this embodiment can be expressed by negative resistance $-RL_i$. For example, when i=1, negative resistance $-RL_1$ is for a fundamental mode vibration and when i=2, negative resistance $-RL_2$ is for a second overtone mode vibration. In this embodiment, the quartz crystal oscillating circuit is constructed so that a ratio of an absolute value of negative resistance, $|-RL_1|$ of the fundamental mode vibration of the amplification circuit and series resistance $R_1$ of the fundamental mode vibration is larger than that of an absolute value of negative resistance, $|-RL_2|$ of the second overtone mode vibration of the amplification circuit and series resistance $R_2$ of the second overtone mode vibration. That is to say, the oscillating circuit is constructed so that it satisfies a relationship of $|-RL_1|/R_1 > |-RL_2|/R_2$. By constructing the oscillating circuit like this, an oscillation of the second overtone mode can be suppressed, as a result of which an output signal of a frequency of the fundamental mode vibration can be provided because an oscillation of the fundamental mode generates easily in the oscillating circuit.

Figure 4:
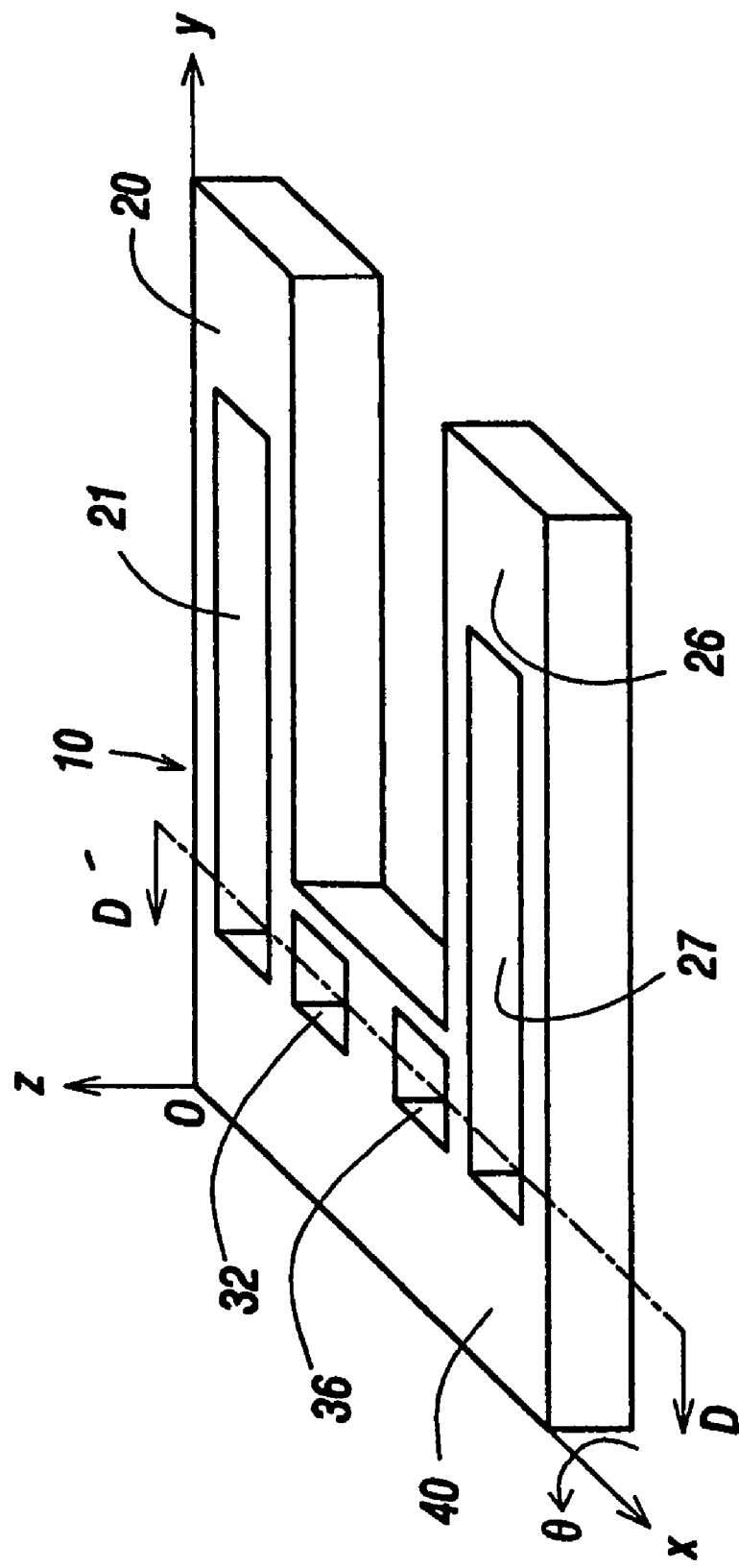
FIG. 4 shows a general view of a flexural mode, quartz crystal tuning fork resonator constructing a quartz crystal oscillator, which constructs an electronic apparatus of the first embodiment of the present invention.

FIG. 4 shows a general view of a flexural mode, quartz crystal tuning fork resonator 10 which is one of a contour mode resonator, constructing a quartz crystal oscillator, which constructs an electronic apparatus of the first embodiment of the present invention and its coordinate system o-xyz. A cut angle θ which has a typical value of 0° to 10° is rotated from a Z-plate perpendicular to the z axis about the x axis. Namely, the flexural mode, quartz crystal tuning fork resonator has the cut angel of ZYw(0° to 10°) according to an expression of the IEEE notation. The resonator 10 comprises two tuning fork tines (vibrating tines) 20 and 26 and a tuning fork base (a base) 40. The tines 20 and 26 have grooves 21 and 27 each of which has a plurality of stepped portions including a third stepped portion and a fourth stepped portion opposite the third stepped portion in the width direction, and a first stepped portion connecting the third stepped portion to the fourth stepped portion, respectively, with the grooves 21 and 27 extending into the base 40. Also, the base 40 has the additional grooves 32 and 36. In addition, the tines 20 and 26 vibrate in a flexural mode of a fundamental mode and an inverse phase.

Figure 5:
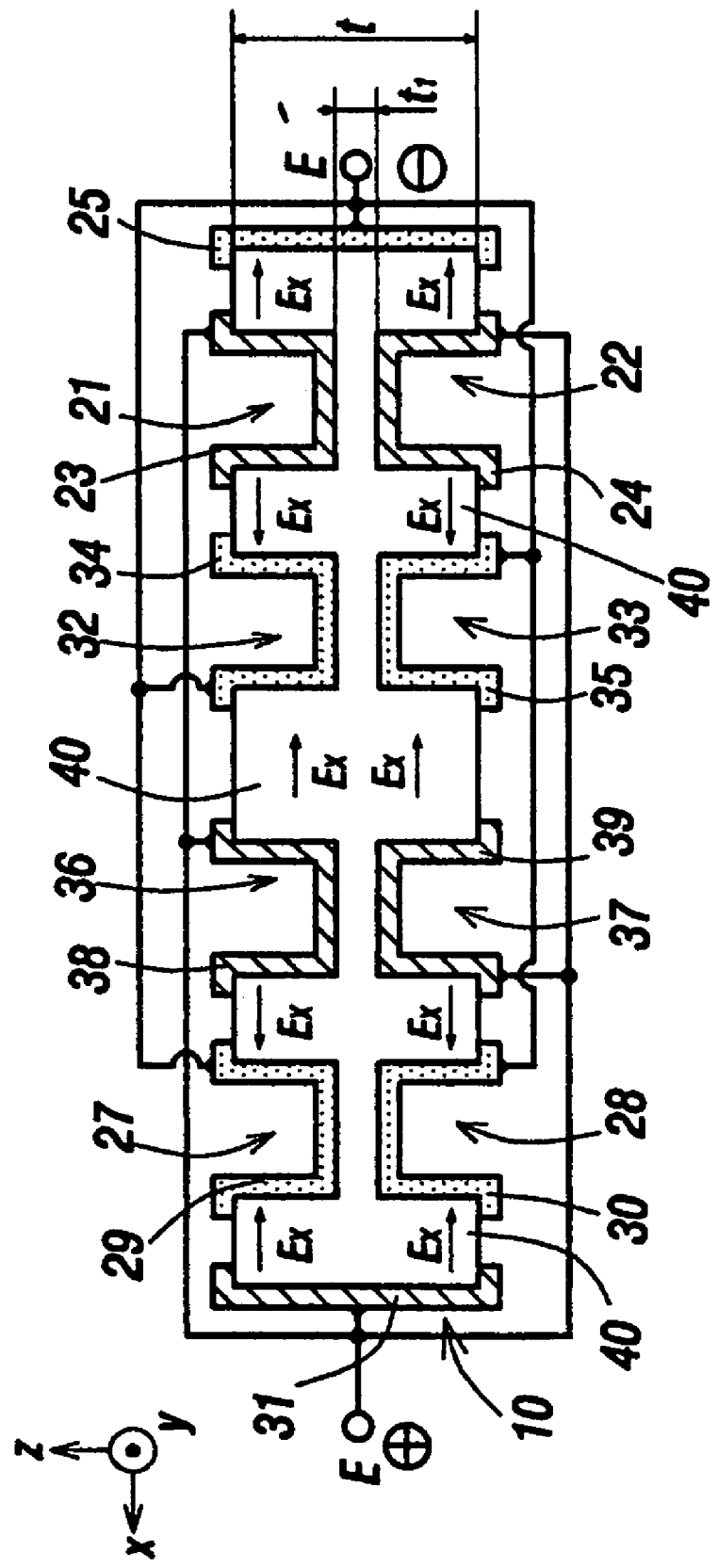
FIG. 5 shows a D-D' cross-sectional view of the tuning fork base of FIG. 4, and illustrating electrode construction.

FIG.5 shows a D-D' cross-sectional view of the tuning fork base 40 of the quartz crystal resonator 10 in FIG.4. In FIG.5, the shape of the electrode construction within the base 40 for the quartz crystal resonator of FIG.4 is described in detail. The section of the base 40 which couples to the tine 20 has the grooves 21 and 22 each of which has a plurality of stepped portions including a third stepped portion and a fourth stepped portion opposite the third stepped portion in the width direction, and a first stepped portion connecting the third stepped portion to the fourth stepped portion, cut into the obverse and reverse faces of the base 40. Also, the section of the base 40 which couples to the tine 26 has the grooves 27 and 28 each of which has a plurality of stepped portions including a third stepped portion and a fourth stepped portion opposite the third stepped portion in the width direction, and a first stepped portion connecting the third stepped portion to the fourth stepped portion, cut into the obverse and reverse faces of the base 40. Thus, the grooves 21, 22 are formed in two of main surfaces (e.g., in first and second opposite main surfaces) of the tuning fork tine 20. Similar to this, the grooves 27, 28 are formed in two of main surfaces (e.g., in first and second opposite main surfaces) of the tuning fork tine 26, and an electrode is disposed on each of the third and fourth stepped portions of each of the grooves 21, 22, 27 and 28. Moreover, each of the tuning fork tines 20, 26 has a first side surface and a second side surface opposite the first side surface, and the third stepped portion is opposite one of the first and second side surfaces and the fourth stepped portion is opposite one of the first and second side surfaces. In addition to these grooves, the base 40 has the grooves 32 and 36 cut between the grooves 21 and 27, and also, the base 40 has the grooves 33 and 37 cut between the grooves 22 and 28.

Furthermore, the grooves 21 and 22 have the first electrodes 23 and 24 both of the same electrical polarity, the grooves 32 and 33 have the second electrodes 34 and 35 both of the same electrical polarity, the grooves 36 and 37 have the third electrodes 38 and 39 both of the same electrical polarity, the grooves 27 and 28 have the fourth electrodes 29 and 30 both of same electrical polarity and the sides of the base 40 have the fifth and sixth electrodes 25 and 31, each of opposite electrical polarity. In more detail, the fifth, fourth, and second electrodes 25, 29, 30, 34 and 35 have the same electrical polarity, while the first, sixth and third electrodes 23, 24, 31, 38 and 39 have the opposite electrical polarity to the others. Two electrode terminals E-E' are constructed. That is, the electrodes disposed inside the grooves constructed opposite each other in the thickness (z axis) direction have the same electrical polarity. Also, the electrodes disposed opposite each other across adjoining grooves have opposite electrical polarity.

In addition, the resonator has a thickness t of the tines or the tines and the base, and a groove thickness $t_1$. It is needless to say that the electrodes are disposed inside the grooves and on the sides of the tines. In this embodiment, the first electrodes 23 and 24 are disposed at the tine and the base, and also, the fourth electrodes 29 and 30 are disposed at the tine and the base. In addition, the electrodes are disposed on the sides of the tines opposite each other to the electrodes disposed inside the grooves. Namely, the electrodes are disposed opposite each other inside the grooves and on the sides of the tines so that the electrodes disposed opposite each other are of opposite electrical polarity. Additionally, electrodes are disposed facing each other on the sides of the tines so that the electrodes disposed facing each other are of opposite electrical polarity, and the tines are capable of vibrating in inverse phase. In more detail, a first tuning fork tine and a second tuning fork tine, and a tuning fork base are formed integrally, an electrode is disposed on both sides of the first tine and the second tine so that the electrodes disposed (facing each other) on inner sides of the first and second tines are of opposite electrical polarity.

When a direct voltage is applied between the electrode terminals E-E' (E terminal: plus, E' terminal: minus), an electric field $E_x$ occurs in the arrow direction as shown in FIG. 5. As the electric field $E_x$ occurs perpendicular to the electrodes disposed on the base, the electric field $E_x$ has a very large value and a large distortion occurs at the base, so that the quartz crystal tuning fork resonator is obtained with a small series resistance $R_1$ and a high quality factor $Q_1$, even if it is miniaturized.

Figure 6:
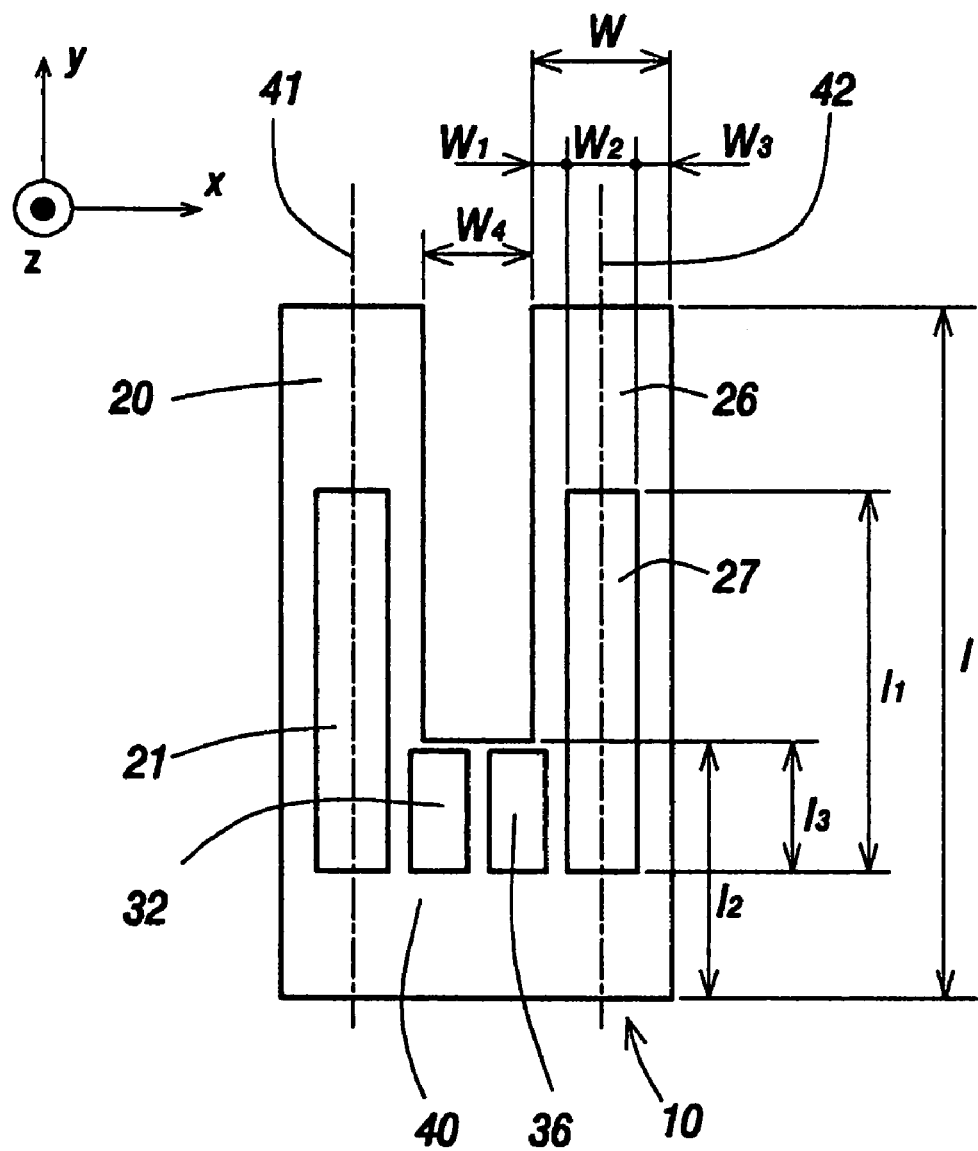
FIG. 6 shows a plan view of a quartz crystal tuning fork resonator of FIG. 4.

FIG. 6 shows a plan view of the resonator 10 of FIG. 4. In FIG. 6, the construction and the dimension of grooves 21, 27, 32 and 36 are described in detail. The groove 21 is constructed to include a portion of the central line 41 of the tine 20, and the groove 27 is similarly constructed to include a portion of the central line 42 of the tine 26. The width $W_2$ of the grooves 21 and 27 (groove width $W_2$) which include a portion of the central lines 41 and 42 respectively, is preferable because moment of inertia of the tines 20 and 26 becomes large and the tines can vibrate in a flexural mode easily. As a result, the quartz crystal tuning fork resonator capable of vibrating in a fundamental mode can be obtained with a small series resistance $R_1$ and a high quality factor $Q_1$.

In more detail, when part widths $W_1$, $W_3$ and a groove width $W_2$ are taken, the tine width W of the tines 20 and 26 has a relationship of $W=W_1+W_2+W_3$, and the part widths $W_1$, $W_3$ are constructed so that $W_1 \geqq W_3$ or $W_1 < W_3$. In addition, the groove width $W_2$ is constructed so that $W_2 \geqq W_1$, $W_3$. In this embodiment, also, the grooves are constructed at the tines so that a ratio ($W_2/W$) of the groove width $W_2$ and the tine width W is larger than 0.35 and less than 1, and a ratio ($t_1/t$) of the groove thickness $t_1$ and the thickness t of the tines (tine thickness t) is less than 0.79, to obtain very large moment of inertia of the tines. That is, the flexural mode, quartz crystal tuning fork resonator, capable of vibrating in the fundamental mode, and having a good frequency stability can be provided with a small series resistance $R_1$, a high quality factor $Q_1$ and a small capacitance ratio $r_1$ because electromechanical transformation efficiency of the resonator becomes large markedly.

Likewise, a length $l_1$ of the grooves 21, 27 provided at the tines 20, 26 extends into the base 40 in this embodiment (which has a dimension of the length $l_2$ and the length $l_3$ of the grooves). Therefore, a groove length and a length of the tines are given by ($l_1-l_3$) and ($l-l_2$), respectively, and a ratio of ($l_1-l_3$) and ($l-l_2$) is within a range of 0.4 to 0.8 to get a flexural mode tuning fork resonator with series resistance $R_1$ of a fundamental mode vibration smaller than series resistance $R_2$ of a second overtone mode vibration. Also, a length $l_2$ of the base is less than 0.5 mm.

Furthermore, the total length l is determined by the frequency requirement and the size of the housing case. Simultaneously, to get a flexural mode, quartz crystal tuning fork resonator, capable of vibrating in a fundamental mode with suppression of the second overtone mode vibration which is an unwanted mode vibration, there is a close relationship between the groove length $l_1$ and the total length l. Namely, a ratio ($l_1/l$) of the groove length $l_1$ and the total length l is within a range of 0.2 to 0.78 because the quantity of charges which generate within the grooves and on the sides of the tines or the tines and the base can be controlled by the ratio, as a result, the second overtone mode vibration which is an unwanted mode vibration, can be suppressed, and simultaneously, a frequency stability of the fundamental mode vibration gets high. Therefore, the flexural mode, quartz crystal tuning fork resonator, capable of vibrating easily in a fundamental mode and having high frequency stability can be provided. Also, the total length l is less than 2.18 mm, preferably, within a range of 1.2 mm to 2 mm, and groove length $l_1$ is less than 1.29 mm, preferably, within a range of 0.35 mm to 1.15 mm, to get a smaller-sized tuning fork resonator which vibrates in a flexural mode and a fundamental mode.

In more detail, series resistance $R_1$ of the fundamental mode vibration becomes smaller than series resistance $R_2$ of the second overtone mode vibration. Namely, $R_1<R_2$, preferably, $R_1<0.86R_2$, therefore, a quartz crystal oscillator comprising an amplifier (CMOS inverter), capacitors, resistors and a quartz crystal unit with the quartz crystal tuning fork resonator of this embodiment can be obtained, which is capable of vibrating in the fundamental mode easily. In addition, in this embodiment the grooves 21 and 27 of the tines 20 and 26 extend into the base 40 in series, but embodiment of the present invention includes a plurality of grooves divided in the length direction of the tines. Namely, the plurality of grooves are formed in each of the two of the main surfaces (e.g., in each of the first and second opposite main surfaces) of each of the tuning fork tines 20, 26. In addition, the grooves may be constructed only at the tines ($l_3=0$). From $l_3=0$, the grooves 21, 22 each of which has a second stepped portion opposite the first stepped portion in the length direction are formed in the two of the main surfaces (e.g., in the first and second opposite main surfaces) of the tuning fork tine 20. Similar to this, the grooves 27, 28 each of which has a second stepped portion opposite the first stepped portion in the length direction are formed in the two of the main surfaces (e.g., in the first and second opposite main surfaces) of the tuning fork tine 26, and the first stepped portion is connected to the second stepped portion through the third and fourth stepped portions.

In this embodiment, the groove length $l_1$ corresponds to electrode length disposed inside the grooves, though the electrode is not shown in FIG. 6, but, when the electrode length is less than the groove length, the length $l_1$ is of the electrode length. Namely, the ratio ($l_1/l$) in this case is expressed by a ratio of electrode length $l_1$ of the grooves and the total length l. In order to achieve the above-mentioned object, it may be satisfied with at least one groove with the ratio constructed at the obverse and reverse faces of each tine. As a result, the flexural mode, quartz crystal tuning fork resonator, capable of vibrating very easily in the fundamental mode and having the high frequency stability can be realized. Also, a fork portion of this embodiment has a rectangular shape, but this invention is not limited to this, for example, the fork portion may have a U shape.

In addition, a space of between the tines is given by $W_4$, and in this embodiment, the space $W_4$ and the groove width $W_2$ are constructed so that $W_4 \geqq W_2$, and more, the space $W_4$ is within a range of 0.05 mm to 0.35 mm and the groove width $W_2$ is within a range of 0.03 mm to 0.12 mm because it is easy to form a tuning fork shape and grooves of the tuning fork tines separately by a photo-lithographic process and an etching process, consequently, a frequency stability for a fundamental mode vibration gets higher than that for a second overtone mode vibration. In this embodiment, a quartz wafer with the thickness t of 0.05 mm to 0.15 mm is used. In order to get a smaller-sized quartz crystal tuning fork resonator, capable of vibrating in a flexural mode, it is necessary that groove width $W_2$ is less than 0.7 mm and tine width W is less than 0.18 mm, and preferably, the W is larger than 0.05 mm and less than 0.1 mm. Also, a groove thickness $t_1$ is within a range of 0.01 mm to 0.085 mm approximately, and part widths $W_1$, $W_3$ are less than 0.021 mm, respectively, preferably, less than 0.015 mm. In addition, a groove provided on at least one of an obverse face and a reverse face of tuning fork tines of the present invention may be a through hole, namely, a groove thickness $t_1=0$.

In more detail, to obtain a flexural mode, quartz crystal tuning fork resonator with a high frequency stability which gives high time accuracy, it is necessary to obtain the resonator whose resonance frequency is not influenced by shunt capacitance because quartz crystal is a piezoelectric material and the frequency stability is very dependent on the shunt capacitance. In order to decrease the influence on the resonance frequency by the shunt capacitance, figure of merit $M_i$ plays an important role. Namely, the figure of merit $M_i$ that expresses inductive characteristics, electromechanical transformation efficiency and a quality factor of a flexural mode, quartz crystal tuning fork resonator, is defined by a ratio $(Q_i/r_i)$ of a quality factor $Q_i$ and capacitance ratio $r_i$, namely, $M_i$ is given by $M_i=Q_i/r_i$, where i shows vibration order of the resonator, and for example, when i=1 and 2, figures of merit $M_1$ and $M_2$ are a value for a fundamental mode vibration and a second overtone mode vibration of the flexural mode, quartz crystal tuning fork resonator, respectively.

Also, a frequency difference $\Delta f$ of resonance frequency $f_s$ of mechanical series independent on the shunt capacitance and resonance frequency $f_r$ dependent on the shunt capacitance is inversely proportional to the figure of merit $M_i$. The larger the value $M_i$ becomes, the smaller the difference $\Delta f$ becomes. Namely, the influence on the resonance frequency $f_r$ by the shunt capacitance decreases because it is close to the resonance frequency $f_s$. Accordingly, the larger the $M_i$ becomes, the higher the frequency stability of the flexural mode, quartz crystal tuning fork resonator becomes because the resonance frequency $f_r$ of the resonator is almost never dependent on the shunt capacitance. Namely, the quartz crystal tuning fork resonator can be provided with a high time accuracy.

In detail, the flexural mode, quartz crystal tuning fork resonator can be obtained with figure of merit $M_1$ of the fundamental mode vibration larger than figure of merit $M_2$ of the second overtone mode vibration by the above-described tuning fork shape, grooves and dimensions. That is to say, a relationship of $M_1>M_2$ is obtained. As an example, when resonance frequency of a flexural mode, quartz crystal tuning fork resonator is about 32.768 kHz for a fundamental mode vibration and the resonator has a value of $W_2/W=0.5$, $t_1/t=0.34$ and $l_1/l=0.48$, though there is a distribution in production, the resonator has a value of $M_1>65$ and $M_2<30$, respectively.

Namely, the flexural mode, quartz crystal tuning fork resonator which vibrates in the fundamental mode can be provided with high inductive characteristics, good electromechanical transformation efficiency (small capacitance ratio $r_1$ and small series resistance $R_1$) and a high quality factor. As a result, a frequency stability of the fundamental mode vibration becomes higher than that of the second overtone mode vibration, and simultaneously, the second overtone mode vibration can be suppressed because capacitance ratio $r_2$ and series resistance $R_2$ of the second overtone mode vibration become larger than capacitance ratio $r_1$ and series resistance $R_1$ of the fundamental mode vibration, respectively. In particular, $r_2$ has a value larger than 1500 in this embodiment.

Therefore, the resonator capable of vibrating in the fundamental mode vibration can be provided with a high time accuracy because it has the high frequency stability. Consequently, a quartz crystal oscillator comprising the flexural mode, quartz crystal tuning fork resonator of this embodiment outputs an oscillation frequency of the fundamental mode vibration as an output signal, and the frequency of the output signal has a very high stability, namely, excellent time accuracy. In other words, the quartz crystal oscillator of this embodiment has a remarkable effect such that a frequency change by ageing becomes extremely small. Also, an oscillation frequency of the resonator of this embodiment is adjusted so that a frequency deviation is within a range of −100 PPM to +100 PPM to a nominal frequency, e.g. 32.768 kHz, after mounting it at a mounting portion of a case or a lid by conductive adhesives or solder.

In addition, the groove thickness $t_1$ of the present invention is the thinnest thickness of the grooves because quartz crystal is an anisotropic material and the groove thickness $t_1$ has a distribution when it is formed by a chemical etching method. In detail, a groove shape of the sectional view of tuning fork tines in FIG. 5 has a rectangular shape, but the groove shape has an about U shape actually. In the above-described embodiments, though the grooves are constructed at the tines, this invention is not limited to this, namely, a relationship of the figures of merit $M_1$ and $M_2$ can be applied to the conventional flexural mode, quartz crystal tuning fork resonator and a relationship of a quartz crystal oscillating circuit comprising an amplification circuit and a feedback circuit can be also applied to the conventional flexural mode, quartz crystal tuning fork resonator to suppress a second overtone mode vibration and to get a high frequency stability for a fundamental mode vibration of the tuning fork resonator.

Figure 7:
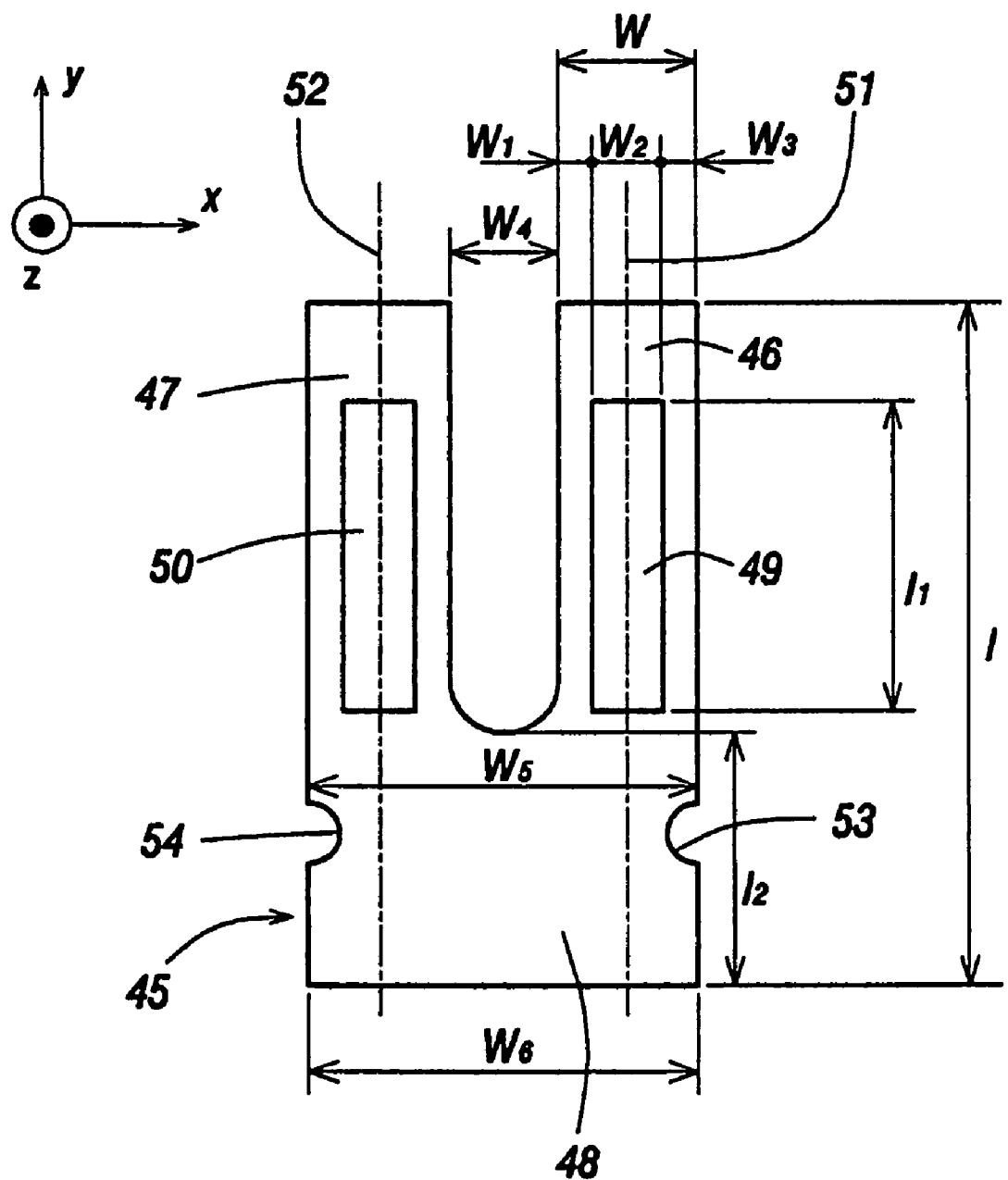
FIG. 7 shows a plan view of a flexural mode, quartz crystal tuning fork resonator constructing a quartz crystal oscillator, which constructs an electronic apparatus of the second embodiment of the present invention.

FIG. 7 shows a plan view of a flexural mode, quartz crystal tuning fork resonator 45 which is one of a contour mode quartz crystal resonator, constructing a quartz crystal oscillator, which constructs an electronic apparatus of the second embodiment of the present invention. The resonator 45 comprises tuning fork tines 46, 47 and a tuning fork base 48. The tines 46, 47 and the base 48 are formed integrally by a chemical etching process. In this embodiment, the base 48 has cut portions 53 and 54. Also, a groove 49 is constructed to include a portion of the central line 51 of the tine 46, and a groove 50 is similarly constructed to include a portion of the central line 52 of the tine 47. In this embodiment, the grooves 49 and 50 are constructed at a part of the tines 46 and 47, and have groove width $W_2$ and groove length $l_1$. In more detail, a groove area $S (=W_2 \times l_1)$ has a value of 0.025 mm² to 0.12 mm² because it is very easy to form the grooves by a chemical etching process and the quartz crystal tuning fork resonator can be provided with good electromechanical transformation efficiency by the formation of the grooves.

Namely, the quartz crystal tuning fork resonator, capable of vibrating in a fundamental mode and having a high frequency stability can be provided with a small series resistance $R_1$ and a high quality factor $Q_1$. Therefore, a quartz crystal oscillator having the high frequency stability can be realized with an output signal of a frequency of the fundamental mode vibration. In this embodiment, though electrodes are not shown in FIG. 7, the electrodes are disposed inside the grooves 49, 50 and on sides of the tines 46 and 47, similar to the resonator of FIG. 4. In detail, the electrodes are disposed opposite each other inside the grooves and on the sides of the tines so that the electrodes disposed opposite each other are of opposite electrical polarity. In more detail, a groove is provided on each of an obverse face and a reverse face of each of the tuning fork tines having a first tuning fork tine and a second tuning fork tine, and also, a first electrode is disposed inside the groove and a second electrode is disposed on each of sides of the tuning fork tines. In addition the quartz crystal tuning fork resonator has two electrode terminals, the one of the electrode terminals comprises the first electrode disposed inside the groove provided on each of the obverse face and the reverse face of the first tuning fork tine and the second electrode disposed on each of the sides of the second tuning fork tine, such that the first and second electrodes are connected, and the other of the electrode terminals comprises the second electrode disposed on each of the sides of the first tuning fork tine and the first electrode disposed inside the groove provided on each of the obverse face and the reverse face of the second tuning fork tine, such that the second and first electrodes are connected. In this embodiment, a groove is provided on each of the obverse face and the reverse face of each of the first and second tuning fork tines, but the present invention in not limited to this, for example, a groove may be provided on at least one of the obverse face and the reverse face of each of the first and second tuning fork tines.

In addition, the base 48 has cut portions 53 and 54, and the cut base 48 has a dimension of width $W_5$ (tines side) and width $W_6$ (opposite side to the tines side). When the base 48 is mounted at a mounting portion (e.g. on two lead wires for a package of a tubular type) of a case or a lid of a surface mounting type or a tubular type by solder or conductive adhesives, it is necessary to satisfy $W_6 \geqq W_5$ to decrease energy losses by vibration. The cut portions 53 and 54 are very effective to decrease the energy losses. Therefore, the flexural mode, quartz crystal tuning fork resonator, capable of vibrating in the fundamental mode and having the high frequency stability (high time accuracy) can be provided with a small series resistance $R_1$ and a high quality factor $Q_1$. Also, the width dimensions $W=W_1+W_2+W_3$ and $W_4$, and the length dimensions $l_1$, $l_2$ and $l$ are as already described in relation to FIG. 6. In addition, a shape of the tuning fork base according to the present invention is not limited to that of this embodiment, for example, a tuning fork base may have a frame portion protruding from the tuning fork base, and the frame portion is mounted at a mounting portion of a case or a lid of a package.

FIG. 8a and FIG. 8b are a top view and a side view for a length-extensional mode quartz crystal resonator which is one of a contour mode resonator, constructing a quartz crystal oscillator, which constructs an electronic apparatus of the third embodiment of the present invention. The resonator 62 comprises a vibrational portion 63, connecting portions 66, 69 and supporting portions 67, 80 including respective mounting portions 68, 81. In addition, the supporting portions 67 and 80 have respective holes 67a and 80a. Also, electrodes 64 and 65 are disposed opposite each other on upper and lower faces of the vibrational portion 63, and the electrodes have opposite electrical polarities. Namely, a pair of electrodes is disposed on the vibrational portion. In this case, a fundamental mode vibration can be excited easily.

In addition, the electrode 64 extends to the mounting portion 81 through the one connecting portion 69 and the electrode 65 extends to the mounting portion 68 through the other connecting portion 66. In this embodiment, the electrodes 64 and 65 disposed on the vibrational portion 63 extend to the mounting portions of the different direction each other. But, the electrodes may be constructed in the same direction. The resonator in this embodiment is mounted on fixing portions of a case or a lid at the mounting portions 68 and 81 by conductive adhesives or solder.

Here, a cutting angle of the length-extensional mode quartz crystal resonator is shown. First, a quartz crystal plate perpendicular to x axis, so called, X plate quartz crystal is taken. Length $L_0$, width $W_0$ and thickness $T_0$ which are each dimension of the X plate quartz crystal correspond to the respective directions of y, z and x axes.

Next, this X plate quartz crystal is, first, rotated with an angle $\theta_x$ of $-30°$ to $+30°$ about the x axis, and second, rotated with an angle $\theta_y$ of $-40°$ to $+40°$ about y' axis which is the new axis of the y axis. In this case, the new axis of the x axis changes to x' axis and the new axis of the z axis changes to z" axis because the z axis is rotated twice about two axes. The length-extensional mode quartz crystal resonator of the present invention is formed from the quartz crystal plate with the rotation angles.

In other words, according to an expression of IEEE notation, a cutting angle of the resonator of the present invention can be expressed by XYtl($-30°$ to $+30°$)/($-40°$ to $+40°$). By choosing a cutting angle of the resonator, a turn over temperature point $T_p$ can be taken at an arbitrary temperature. In this embodiment, length $L_0$, width $W_0$ and thickness $T_0$ correspond to y', z" and x' axes, respectively. But, when the X plate is rotated once about the x axis, the z" axis corresponds to the z' axis. In addition, the vibrational portion 63 has a dimension of length $L_0$ greater than width $W_0$ and thickness $T_0$ smaller than the width $W_0$. Namely, a coupling between length-extensional mode and width-extensional mode gets so small as it can be ignored, as a result of which, the quartz crystal resonator can vibrate in a single length-extensional mode.

In more detail, resonance frequency of the length-extensional mode resonator is inversely proportional to length $L_0$, and it is almost independent on such an other dimension as width $W_0$, thickness $T_0$, connecting portions and supporting potions. Also, in order to obtain a length-extensional mode quartz crystal resonator capable of vibrating in a fundamental mode with a frequency of 1 MHz to 10 MHz, the length $L_0$ is within a range of about 0.26 mm to about 2.7 mm. In addition, when a length-extensional mode resonator vibrates in an overtone mode, an odd number (n) pair of electrodes are disposed on a vibrational portion of the resonator, where n has a value of 1, 3, 5, . . . . In this case, the length $L_0$ is a range of about (0.26 to 2.7)×n mm. Thus, the miniature length-extensional mode resonator can be provided with the frequency of 1 MHz to 10 MHz.

Next, a value of a piezoelectric constant $e_{12}$ ($=e'_{12}$) is described, which is of great importance and necessary to excite a flexural mode, quartz crystal resonator and a length-extensional mode quartz crystal resonator of the present invention. The larger a value of the piezoelectric constant $e_{12}$ becomes, the higher electromechanical transformation efficiency becomes. The piezoelectric constant $e_{12}$ of the present invention can be calculated using the piezoelectric constants $e_{11}$=0.171 C/m$^2$ and $e_{14}$=$-$0.0406 C/m$^2$ of quartz crystal. As a result, the piezoelectric constant $e_{12}$ of the present invention is within a range of 0.095 C/m$^2$ to 0.19 C/m$^2$ approximately in an absolute value. It is, therefore, easily understood that this value is enough large to obtain a flexural mode, quartz crystal tuning fork resonator and a length-extensional mode quartz crystal resonator with a small series resistance $R_1$ and a high quality factor Q. Especially, in order to obtain a flexural mode, quartz crystal tuning fork resonator with a smaller series resistance $R_1$, the $e_{12}$ is within a range of 0.12 C/m$^2$ to 0.19 C/m$^2$ in the absolute value, and also, a groove and electrodes are provided on at least one of an obverse face and a reverse face of tuning fork tines so that when each tuning fork tine is divided into two portions (an inner portion located at a fork side and an outer portion located opposite to the fork side) versus a central line portion thereof, a value of $e_{12}$ of each portion of each tuning fork tine has an opposite sign each other. Namely, when the one of the two portions has $e_{12}$ of a plus sign, the other of the two portions has $e_{12}$ of a minus sign. In more detail, a groove and electrodes are provided at tuning fork tines so that a sign of $e_{12}$ of inner portions of each tuning fork tine is opposite to the sign of $e_{12}$ of outer portions of each tuning fork tine.

When an alternating current voltage is applied between the electrodes 64 and 65 shown in FIG. 8b, an electric field $E_x$ occurs alternately in the thickness direction, as shown by the arrow direction of the solid and broken lines in FIG. 8b. Consequently, the vibrational portion 63 is capable of extending and contracting in the length direction.

Figure 9:
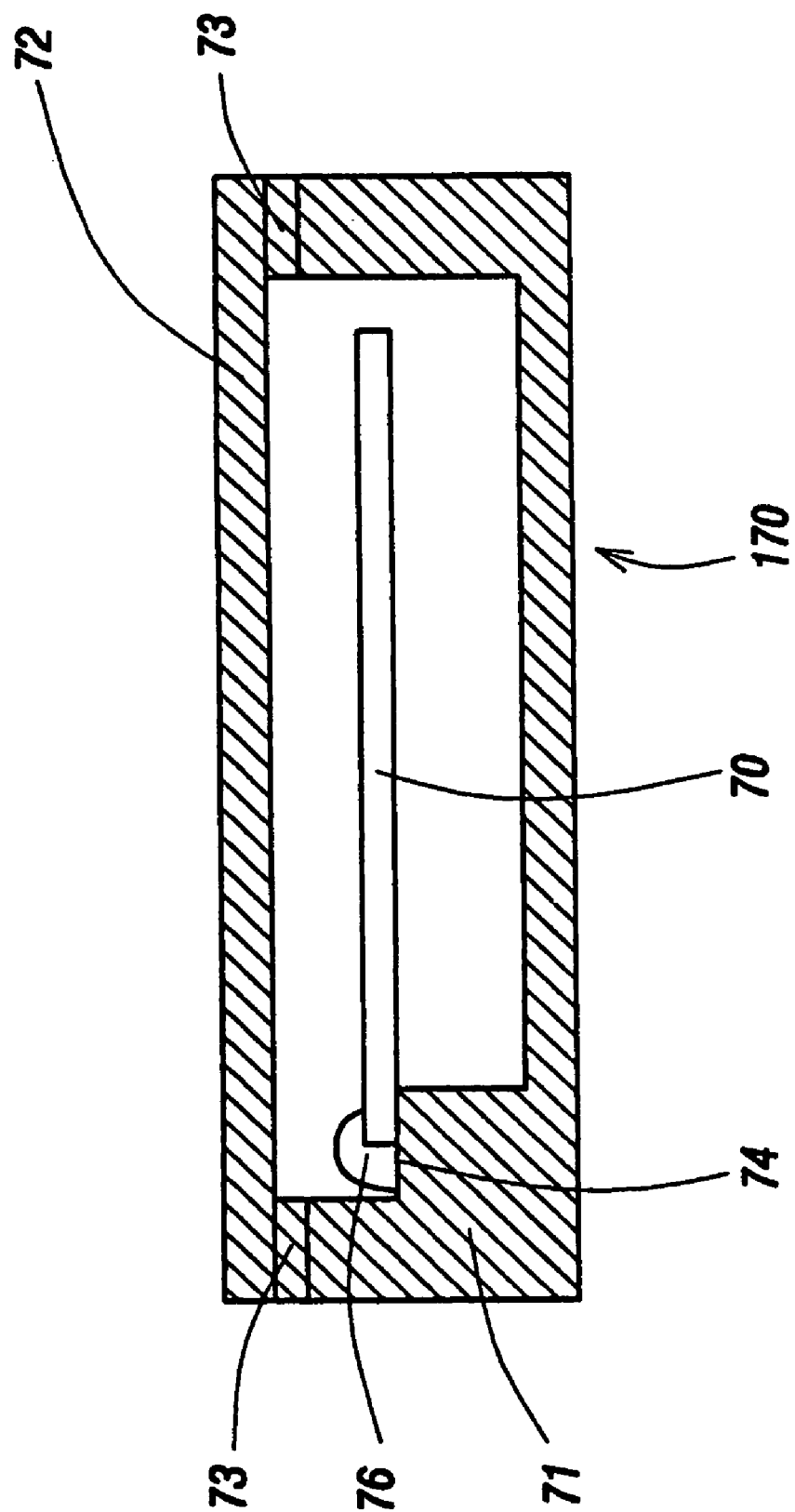
FIG. 9 shows a cross-sectional view of a quartz crystal unit constructing a quartz crystal oscillator, which constructs an electronic apparatus of the fourth embodiment of the present invention.

FIG. 9 shows a cross-sectional view of a quartz crystal unit constructing a quartz crystal oscillator, which constructs an electronic apparatus of the fourth embodiment of the present invention. The quartz crystal unit 170 comprises a contour mode quartz crystal resonator 70 or a thickness shear mode quartz crystal resonator 70, a case 71 and a lid 72. In more detail, the resonator 70 is mounted at a mounting portion 74 of the case 71 by conductive adhesives 76 or solder. Also, the case 71 and the lid 72 are connected through a connecting member 73. For example, the contour mode resonator 70 in this embodiment is the same resonator as one of the flexural mode, quartz crystal tuning fork resonators 10 and 45 described in detail in FIG. 4-FIG. 7. Also, in this embodiment, circuit elements are connected at outside of the quartz crystal unit to get a quartz crystal oscillator. Namely, only the quartz crystal tuning fork resonator is housed in the unit and also, it is housed in the unit in vacuum. In this embodiment, the quartz crystal unit of a surface mounting type is shown, but the quartz crystal tuning fork resonator may be housed in a tubular type, namely a quartz crystal unit of the tubular type. Also, instead of the flexural mode, quartz crystal tuning fork resonator and the thickness shear mode quartz crystal resonator, one of a length-extensional mode quartz crystal resonator, a width-extensional mode quartz crystal resonator and a Lame mode quartz crystal resonator which are a contour mode resonator, respectively, or a SAW (Surface Acoustic Wave) resonator may be housed in the unit. In addition, the present invention is not limited to the quartz crystal unit having the contour mode quartz crystal resonator or the thickness shear mode quartz crystal resonator in this embodiment, for example, the present invention also includes a quartz crystal unit having a piezoelectric filter, e.g. a SAW piezoelectric filter or a piezoelectric sensor, e.g. an angular velocity piezoelectric sensor.

In addition, a member of the case and the lid is ceramics or glass and a metal or glass, respectively, and a connecting member is a metal or glass with low melting point. Also, a relationship of the resonator, the case and the lid described in this embodiment is applied to a quartz crystal oscillator of the present invention which will be described in FIG. 10.

Figure 10:
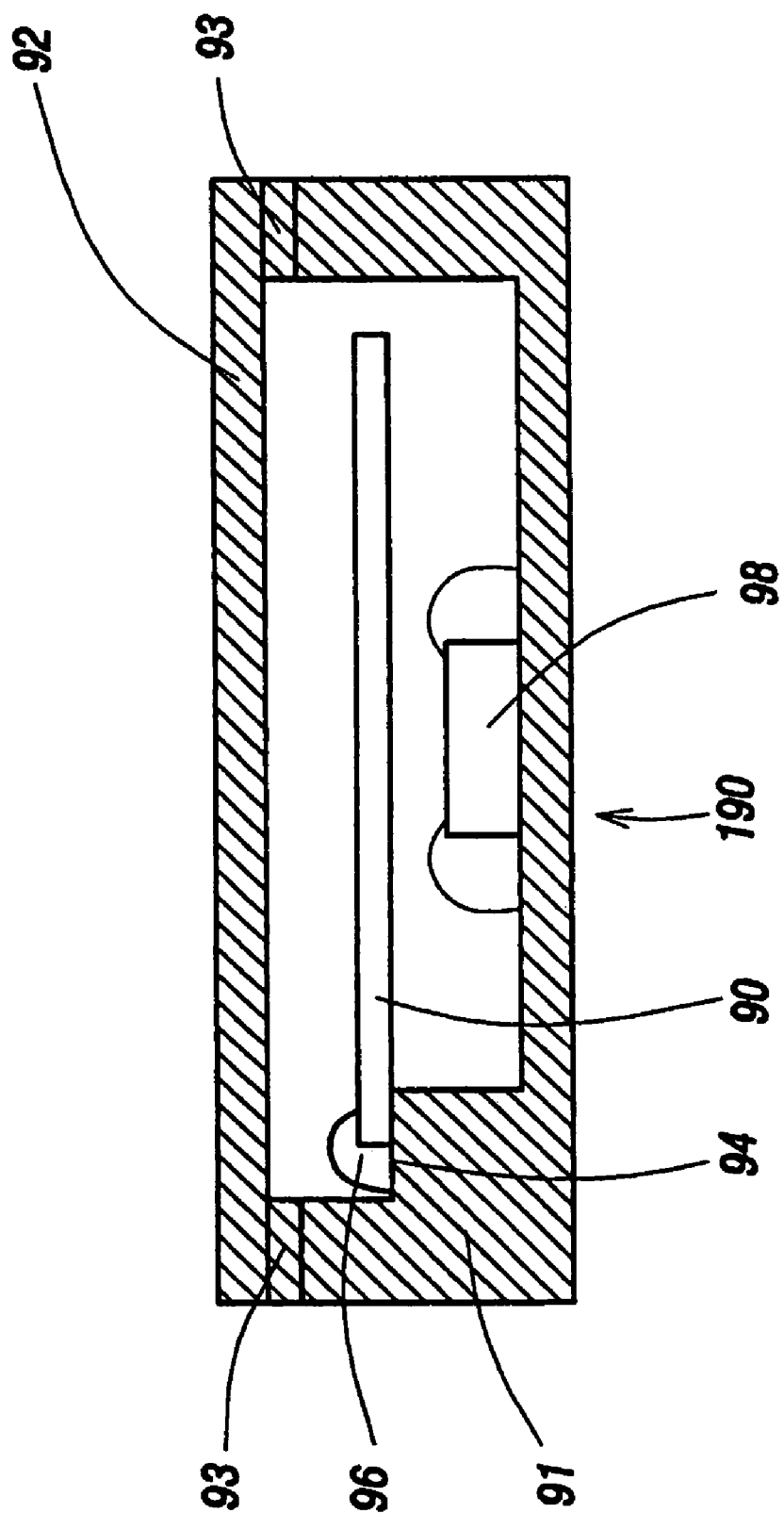
FIG. 10 shows a cross-sectional view of a quartz crystal oscillator, which constructs an electronic apparatus of the fifth embodiment of the present invention.

FIG. 10 shows a cross-sectional view of a quartz crystal oscillator, which constructs an electronic apparatus of the fifth embodiment of the present invention. The quartz crystal oscillator 190 comprises a quartz crystal oscillating circuit, a case 91 and a lid 92. In this embodiment, circuit elements constructing the oscillating circuit are housed in a quartz crystal unit comprising a contour mode quartz crystal resonator 90 or a thickness shear mode quartz crystal resonator 90, the case 91 and the lid 92. Also, the oscillating circuit of this embodiment comprises an amplifier 98 including a feedback resistor, the resonator 90, capacitors (not shown here) and a drain resistor (not shown here), and a CMOS inverter is used as the amplifier 98.

In addition, in this embodiment, the resonator 90 is mounted at a mounting portion 94 of the case 91 by conductive adhesives 96 or solder. As described above, the amplifier 98 is housed in the quartz crystal unit and mounted at the case 91. Also, the case 91 and the lid 92 are connected through a connecting member 93. For example, the contour mode resonator 90 of this embodiment is the same as one of the flexural mode, quartz crystal tuning fork resonators 10 and 45 described in detail in FIG. 4-FIG. 7. Also, instead of the flexural mode, quartz crystal tuning fork resonator and the thickness shear mode quartz crystal resonator, one of a length-extensional mode quartz crystal resonator, a width-extensional mode quartz crystal resonator and a Lame mode quartz crystal resonator which are a contour mode resonator, respectively, or a SAW (Surface Acoustic Wave) resonator may be housed in the unit.

Likewise, in this embodiment, a piece of flexural mode, quartz crystal tuning fork resonator is housed in the unit, but the present invention also includes a quartz crystal unit having a plurality of flexural mode, quartz crystal tuning fork resonators, and at least two of the plurality of resonators are connected electrically in parallel. In addition, the at least two resonators may be an individual resonator or may be individual resonators that are formed integrally at each tuning base through a connecting portion.

Next, a method for manufacturing a quartz crystal oscillator, which constructs an electronic apparatus of the present invention, is described in detail, according to the manufacturing steps.

Figure 11:
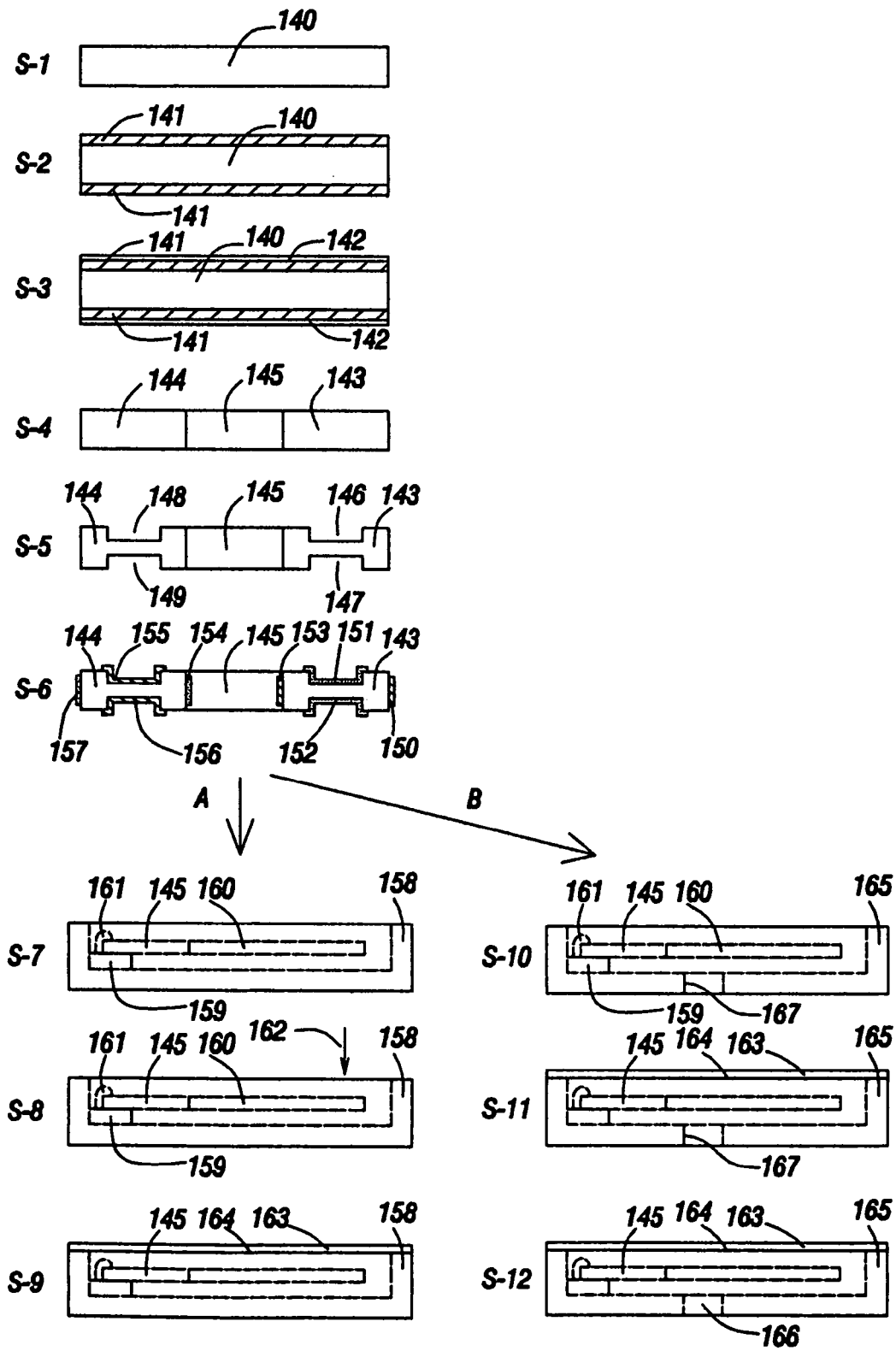
FIG. 11 shows a step diagram of a method for manufacturing a quartz crystal unit constructing a quartz crystal oscillator, which constructs an electronic apparatus of the present invention.
Figure 12:
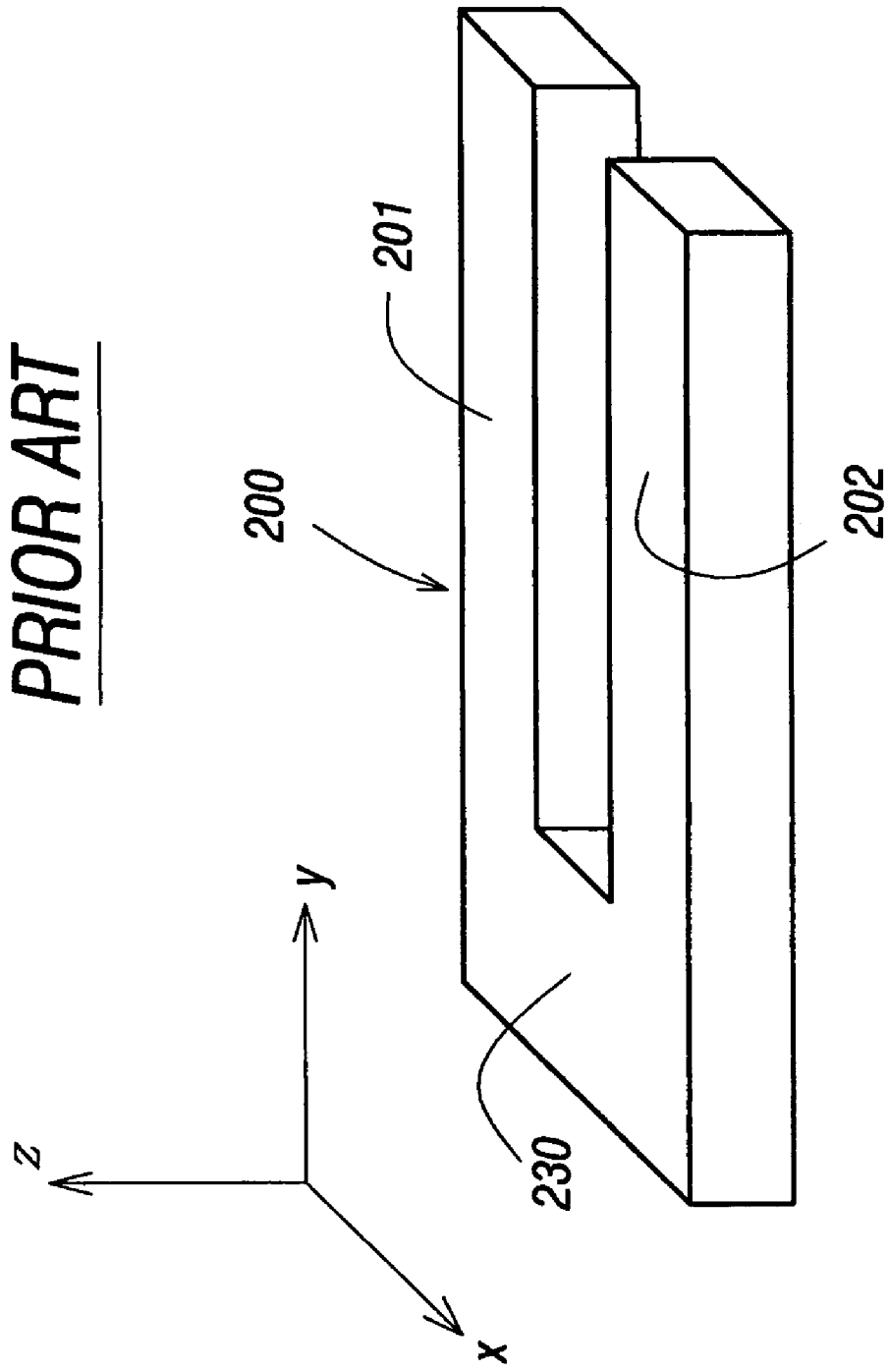
FIG. 12 is a general view of the conventional flexural mode, quartz crystal tuning fork resonator constructing a quartz crystal oscillator of the prior art, which constructs the conventional electronic apparatus.
Figure 13:
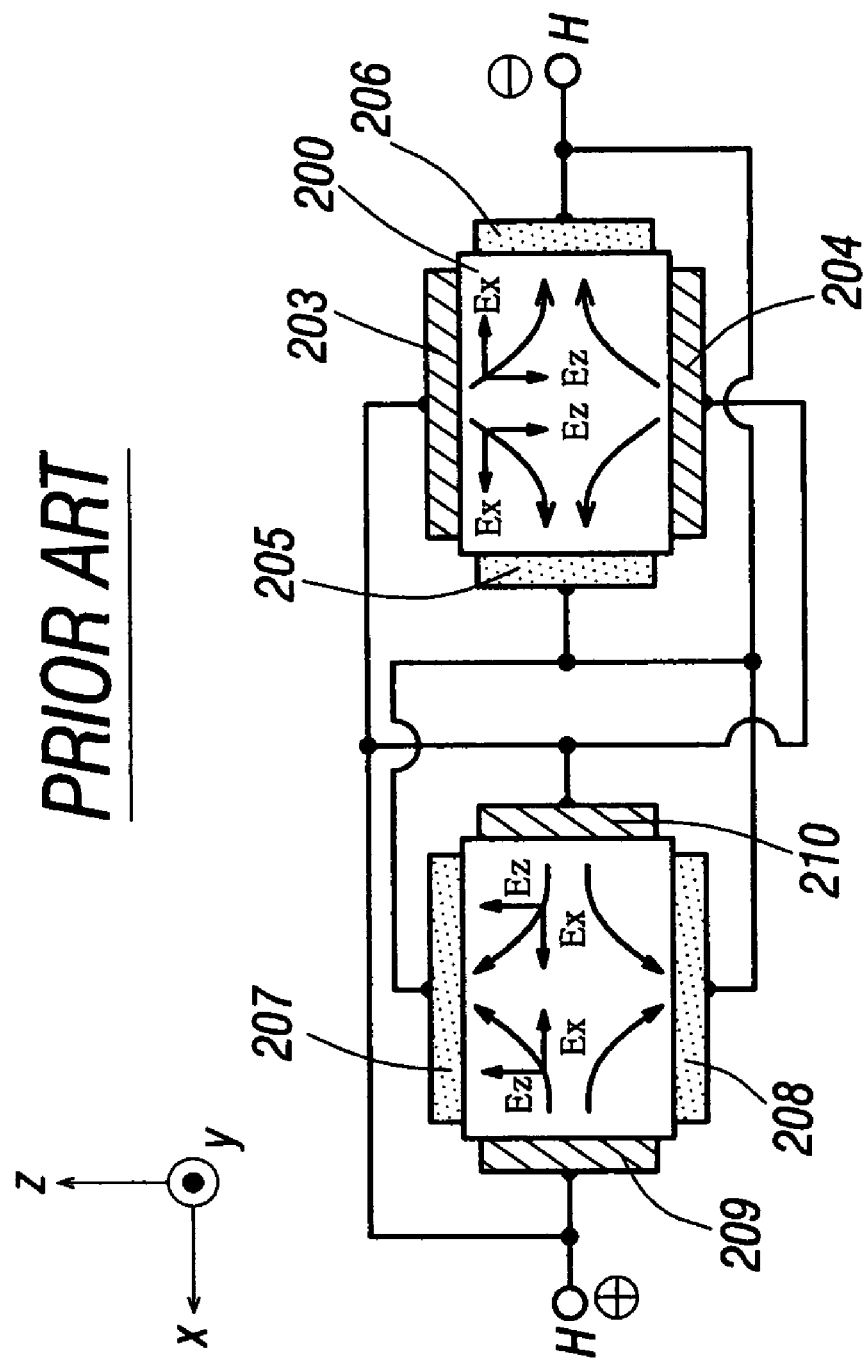
FIG. 13 is a cross-sectional view of the tuning fork tines of FIG. 12, and illustrating electrode construction.

FIG. 11 shows an embodiment of a method for manufacturing a quartz crystal oscillator, which constructs an electronic apparatus of the present invention and a step diagram embodying the present invention. The signs of S-1 to S-12 are the step numbers. First, S-1 shows a cross-sectional view of a quartz crystal wafer 140. Next, in S-2 a metal film 141, for example, chromium and gold on the chromium are, respectively, disposed on upper and lower faces of the quartz crystal wafer 140 by an evaporation method or a spattering method. In addition, a resist 142 is spread on the metal film 141 in S-3, and after the metal film 141 and the resist 142 are removed except those of tuning fork shape by a photo-lithographic process and an etching process, the tuning fork shape with tuning fork tines 143, 144 and a tuning fork base 145, as be shown in S-4, is integrally formed by a chemical etching process, namely, in a first etching process. When the tuning fork shape is formed, cut portions may be formed at the tuning fork base. In FIG.11, the formation of a piece of tuning fork shape is shown, but, a number of tuning fork shapes are actually formed in a piece of quartz crystal wafer.

Similar to the steps of S-2 and S-3, a metal film and a resist are spread again on the tuning fork shape of S-4 and grooves 146, 147, 148 and 149 each of which has two step difference portions i.e., two stepped portions including a third stepped portion and a fourth stepped portion opposite the third stepped portion in the width direction along the length direction of the tuning fork tines, are formed in two of main surfaces (e.g., in first and second opposite main surfaces) of each of the tuning fork tines 143, 144 by a photo-lithographic process and an etching process, namely, in a second etching process different from the first etching process, and the shape of S-5 is obtained after all of the resist and the metal film is removed. Thus the grooves 146, 147, 148 and 149 are formed after the tuning fork tines 143, 144 are formed. In addition, a metal film and a resist are spread again on the shape of S-5 and electrodes which are of opposite electrical polarity, are disposed on sides of the tines and inside the grooves thereof, as be shown in S-6.

Namely, electrodes 150, 153 disposed on the sides of the tuning fork tine 143 and electrodes 155, 156 disposed inside the grooves 148, 149, i.e., on the third and fourth stepped portions of the grooves 148, 149, of the tuning fork tine 144 have the same electrical polarity. Similarly, electrodes 151, 152 disposed inside the grooves 146, 147 i.e., on the third and fourth stepped portions of the grooves 146, 147 of the tuning fork tine 143 and electrodes 154, 157 disposed on the sides of the tuning fork tine 144 have the same electrical polarity. Each of the electrodes 151, 152, 155 and 156 extends on a surface in the width direction adjoining the groove. Two electrode terminals are, therefore, constructed. In more detail, when an alternating current (AC) voltage is applied between the terminals, the tuning fork tines vibrate in a flexural mode of an inverse phase because said electrodes disposed on the stepped portions of the grooves and the electrodes disposed opposite the said electrodes have opposite electrical polarity. In the step of S-6, a piece of quartz crystal tuning fork resonator, capable of vibrating in a flexural mode is shown in the quartz crystal wafer, but a number of quartz crystal tuning fork resonators are actually formed in the quartz crystal wafer.

In addition, an oscillation frequency for the quartz crystal tuning fork resonator is adjusted by different steps of at least twice and the first adjustment of the oscillation frequency for the quartz crystal tuning fork resonator is performed in the quartz crystal wafer by a laser method or an evaporation method or an ion etching method so that the oscillation frequency has a preselected oscillation frequency with a frequency deviation which is within a range of −9000 PPM to +5000 PPM (Parts Per Million) to a nominal frequency of 10 kHz to 200 kHz, e.g. 32.768 kHz. The first adjustment of the oscillation frequency by the laser method or the ion etching method is performed by trimming mass disposed on the tuning fork tines and the first adjustment of the oscillation frequency by the evaporation method is performed by adding mass on the tuning fork tines. Namely, by using those methods the oscillation frequency can be changed. Also, the resonators formed in the quartz crystal wafer are inspected therein and when there is a failure resonator, it is removed from the wafer or something is marked on it or it is remembered by a computer.

In this embodiment, the tuning fork shape is formed from the step of S-3 and after that, the grooves are formed at the tuning fork tines, namely, the tuning fork tines are formed before the grooves are formed, but this invention is not limited to said embodiment, for example, the grooves are first formed from the step of S-3 and after that, the tuning fork shape may be formed, namely, the grooves are formed before the tuning fork tines are formed. Also, the tuning fork shape and the grooves may be formed simultaneously, namely, the tuning fork tines and the grooves are formed simultaneously.

There are two methods of A and B in the following step, as be shown by arrow signs. For the step of A, the tuning fork base 145 of the formed flexural mode, quartz crystal tuning fork resonator 160 is first mounted on mounting portion 159 of a case 158 by conductive adhesives 161 or solder, as be shown in S-7. Next, the second adjustment of resonance (oscillation) frequency for the resonator 160 is performed by laser 162 or evaporation or ion etching method in S-8 so that a frequency deviation is within a range of −100 PPM to +100 PPM to the nominal frequency of 10 kHz to 200 kHz, e.g. 32.768 kHz. Finally, the case 158 and a lid 163 are connected via glass 164 with the low melting point or a metal in S-9. In this case, the connection of the case and the lid is performed in vacuum because the case 158 has no hole to close it in vacuum.

In addition, though it is not visible in FIG. 11, the third frequency adjustment may be performed by laser after the step of the connection of S-9 to get a small frequency deviation to the nominal frequency when a material of the lid is glass. As a result of which it is possible to get the resonator with the frequency deviation which is within a range of −50 PPM to +50 PPM to the nominal frequency of 10 kHz to 200 kHz, e.g. 32.768 kHz. Namely, the nominal frequency, capable of vibrating in a fundamental mode is less than 200 kHz. In this step, when the third frequency adjustment is performed, a/an resonance (oscillation) frequency of said resonators is adjusted so that the frequency deviation by the second frequency adjustment is within a range of −950 PPM to +950 PPM to the nominal frequency, e.g. 32.768 kHz.

For the step of B, the tuning fork base 145 of the formed resonator 160 is first mounted on a mounting portion 159 of a case 165 by conductive adhesives 161 or solder in S-10, in addition, in S-11 the case 165 and a lid 163 are connected by the same way as that of S-9, in more detail, after the resonator was mounted on the mounting portion of the case or after the resonator was mounted at the mounting portion, and the case and the lid were connected, the second adjustment of resonance (oscillation) frequency is performed so that a frequency deviation is generally within a range of −100 PPM to +100 PPM to a nominal frequency of 10 kHz to 200 kHz, e.g. 32.768 kHz in vacuum, but, it may be within a wider range, for example, −950 PPM to +950 PPM when the third frequency adjustment as will be shown as follows, is performed. Finally, a hole 167 constructed at the case 165 is closed in vacuum using such a metal 166 as solder or glass with the low melting point in S-12.

Also, similar to the step of A, the third adjustment of resonance (oscillation) frequency may be performed by laser after the step of S-12 to get a small frequency deviation to the nominal frequency. As a result of which it is possible to get the resonator with the frequency deviation which is within a range of −50 PPM to +50 PPM to the nominal frequency, e.g. 32.768 kHz. Thus, a frequency deviation of the resonators in the case of A and B is finally within a range of −100 PPM to +100 PPM at most. Also, the second frequency adjustment may be performed after the case and the lid were connected and the hole was closed in vacuum. In addition, the hole is constructed at the case, but may be constructed at the lid. Also, the frequency adjustment of the present invention is performed in vacuum or inert gas such as nitrogen gas or atmosphere, and the values described above are values in vacuum.

Therefore, the flexural mode, quartz crystal tuning fork resonators and the quartz crystal units manufactured by the above-described method are miniaturized and realized with a small series resistance $R_1$, a high quality factor $Q_1$ and low price.

Moreover, in the above-described embodiment, though the first frequency adjustment of the resonators is performed in the quartz crystal wafer and at the same time, when there is a failure resonator, something is marked on it or it is removed from the quartz crystal wafer, but the present invention is not limited to this, namely, the present invention may include the step to inspect the flexural mode, quartz crystal tuning fork resonators formed in the quartz crystal wafer therein, in other words, the step to inspect whether there is a failure resonator or not in the quartz crystal wafer. When there is a failure resonator in the wafer, something is marked on it or it is removed from the wafer or it is remembered by a computer. By including the step, it can increase the yield because it is possible to find out the failure resonator in an early step and the failure resonator does not go to the next step. As a result of which low priced flexural mode, quartz crystal tuning fork resonators can be provided with excellent electrical characteristics.

In this embodiment, the frequency adjustment is performed three times by a separate step, but may be performed at least twice by a separate step. For example, the third frequency adjustment may be omitted. In addition, in order to construct a quartz crystal oscillator, two electrode terminals of the resonators are connected electrically to an amplifier, capacitors and resistors. In other words, a quartz crystal oscillating circuit is constructed and connected electrically so that an amplification circuit comprises a CMOS inverter and a feedback resistor and a feedback circuit comprises a flexural mode, quartz crystal tuning fork resonator, a drain resistor, a capacitor of a gate side and a capacitor of a drain side. Also, the third frequency adjustment may be performed after the quartz crystal oscillating circuit was constructed in a quartz crystal unit.

Likewise, the flexural mode quartz crystal resonator of a tuning fork type has two tuning fork tines in the present embodiments, but embodiments of the present invention include tuning fork tines more than two. In addition, the quartz crystal tuning fork resonators of the present embodiments are housed in a package (unit) of a surface mounting type comprising a case and a lid, but may be housed in a package of a tubular type.

In addition, for the tuning fork resonators constructing the quartz crystal oscillators of the first embodiment to the fourth embodiment of the present invention, the resonators are provided so that a capacitance ratio $r_1$ of a fundamental mode vibration gets smaller than a capacitance ratio $r_2$ of a second overtone mode vibration, in order to obtain a frequency change of the fundamental mode vibration larger than that of the second overtone mode vibration, versus the same change of a value of load capacitance $C_L$. Namely, a variable range of a frequency of the fundamental mode vibration gets wider than that of the second overtone mode vibration.

In more detail, for example, when $C_L$=18 pF and the $C_L$ changes in 1 pF, the frequency change of the fundamental mode vibration becomes larger than that of the second overtone mode vibration because the capacitance ratio $r_1$ is smaller than the capacitance ratio $r_2$. Therefore, there is a remarkable effect for the fundamental mode vibration, such that the resonators can be provided with the frequency variable in the wide range, even when the value of load capacitance $C_L$ changes slightly. Accordingly, when a variation of the same frequency is required, the number of capacitors which are used in the quartz crystal oscillators decreases because the frequency change versus load capacitance 1 pF becomes large, as compared with that of the second overtone mode vibration. As a result, the low priced oscillators can be provided.

Moreover, capacitance ratios $r_1$ and $r_2$ of a flexural mode, quartz crystal tuning fork resonator are given by $r_1=C_0/C_1$ and $r_2=C_0/C_2$, respectively, where $C_0$ is shunt capacitance in an electrical equivalent circuit of the resonator, and $C_1$ and $C_2$ are, respectively, motional capacitance of a fundamental mode vibration and a second overtone mode vibration in the electrical equivalent circuit of the resonator. In addition, the flexural mode, quartz crystal tuning fork resonator has a quality factor $Q_1$ for the fundamental mode vibration and a quality factor $Q_2$ for the second overtone mode vibration.

In detail, the tuning fork resonator of this embodiment is provided so that the influence on resonance frequency of the fundamental mode vibration by the shunt capacitance becomes smaller than that of the second overtone mode vibration by the shunt capacitance, namely, so that it satisfies a relationship of $S_1=r_1/2Q_1^2<S_2=r_2/2Q_2^2$, preferably, $S_1<S_2/2$. As a result, the tuning fork resonator, capable of vibrating in the fundamental mode and having a high frequency stability can be provided because the influence on the resonance frequency of the fundamental mode vibration by the shunt capacitance becomes so extremely small as it can be ignored. Also, the present invention replaces $r_1/2Q_1^2$ with $S_1$ and $r_2/2Q_2^2$ with $S_2$, respectively, and here, $S_1$ and $S_2$ are called "a stable factor of frequency" of the fundamental mode vibration and the second overtone mode vibration.

In addition, when a power source is applied to the quartz crystal oscillating circuit, at least one oscillation which satisfies an amplitude condition and a phase condition of vibration starts in the circuit, and a spent time to get to about ninety percent of the steady amplitude of the vibration is called "rise time". Namely, the shorter the rise time becomes, the easier the oscillation becomes. When rise time $t_{r1}$ of the fundamental mode vibration and rise time $t_{r2}$ of the second overtone mode vibration in the circuit are taken, $t_{r1}$ and $t_{r2}$ are given by $t_{r1}=kQ_1/(\omega_1(-1+|-RL_1|/R_1))$ and $t_{r2}=kQ_2/(\omega_2(-1+|-RL_2|/R_2))$, respectively, where k is constant and $\omega_1$ and $\omega_2$ are an angular frequency for the fundamental mode vibration and the second overtone mode vibration, respectively.

From the above-described relation, it is possible to obtain the rise time $t_{r1}$ of the fundamental mode vibration less than the rise time $t_{r2}$ of the second overtone mode vibration. As an example, when resonance (oscillation) frequency of a flexural mode, quartz crystal tuning fork resonator is about 32.768 kHz for a fundamental mode vibration and the resonator has a value of $W_2/W$=0.5, $t_1/t$=0.34 and $l_1/l$=0.48, though there is a distribution in production, as an example, the resonator has a value of $Q_1$=62,000 and $Q_2$=192,000, respectively. In this embodiment, $Q_2$ has a value of about three times of $Q_1$. Accordingly, to obtain the $t_{r1}$ less than the $t_{r2}$, it is necessary to satisfy a relationship of $|-RL_1|/R_1>2|-RL_2|/R_2-1$ by using a relation of $\omega_2=6\omega_1$ approximately. Also, according to this invention, the relationship is not limited to the quartz crystal oscillating circuit comprising the resonator in this embodiment, but this invention also includes all quartz crystal oscillating circuits to satisfy the relationship. By constructing the oscillating circuit like this, a quartz crystal oscillator with the flexural mode, quartz crystal tuning fork resonator can be provided with a short rise time. In other words, an output signal of the oscillator has an oscillation frequency of the fundamental mode vibration of the resonator and is outputted through a buffer circuit. Namely, the second overtone mode vibration can be suppressed in the oscillating circuit. In this embodiment, the resonator has also a value of $r_1$=320 and $r_2$=10,600 as an example. According to this invention, $r_1$ has a value of 210 to 520.

The above-described quartz crystal resonators are formed by at least one method of chemical, mechanical and physical methods. The mechanical method, for example, uses a particle such as GC#1000 and the physical method, for example, uses atom or molecule. Therefore, these methods are called "a particle method" here.

Thus, the electronic apparatus of this invention comprising a display portion and a quartz crystal oscillator at least may operate normally because the quartz crystal oscillator comprises the quartz crystal oscillating circuit with a high frequency stability, namely, a high frequency reliability.

As described above, it will be easily understood that the electronic apparatus comprising the quartz crystal oscillator comprising the quartz crystal oscillating circuit having the flexural mode, quartz crystal tuning fork resonator with novel shapes, the novel electrode construction and excellent electrical characteristics, according to the present invention, may have the outstanding effects. Similar to this, it will be easily understood that the electronic apparatus comprising the quartz crystal oscillator comprising the quartz crystal oscillating circuit having the length-extensional mode quartz crystal resonator with the novel cutting angle and the novel shape, according to the present invention, may have also the outstanding effect. In addition to this, while the present invention has been shown and described with reference to preferred embodiments thereof, it will be understood by those skilled in the art that the changes in shape and electrode construction can be made therein without departing from the spirit and scope of the present invention.

What is claimed is:

1. An electronic apparatus comprising:
at least one quartz crystal oscillator comprised of a quartz crystal oscillating circuit having a quartz crystal resonator, an amplifier, at least one resistor, and a plurality of capacitors;
wherein the quartz crystal resonator comprises a quartz crystal tuning fork resonator capable of vibrating in a flexural mode of an inverse phase, the quartz crystal tuning fork resonator having a quartz crystal tuning fork base, first and second quartz crystal tuning fork tines connected to the quartz crystal tuning fork base, each of the first and second quartz crystal tuning fork tines having a first main surface and a second main surface opposite the first main surface, and a first side surface and a second side surface opposite the first side surface, and at least one groove having a first stepped portion and a second stepped portion opposite the first stepped portion in the length direction formed in at least one of the first and second main surfaces of each of the first and second quartz crystal tuning fork tines; and
wherein a length of the at least one groove formed in at least one of the first and second main surfaces of each of the first and second quartz crystal tuning fork tines is within a range of 20% to 78% of an overall length of the quartz crystal tuning fork resonator, the quartz crystal tuning fork resonator having a cutting angle of ZYw(0° to 10°) and a piezoelectric constant $e_{12}$ within a range of 0.095 $C/m^2$ to 0.19 $C/m^2$ in the absolute value.

2. An electronic apparatus according to claim 1; wherein the quartz crystal tuning fork base has a first portion having a first width $W_5$ and a second portion having a second width $W_6$ greater than or equal to the first width $W_5$; wherein two cut portions are formed between the first and second portions of the quartz crystal tuning fork base; wherein the at least one groove having the first and second stepped portions is formed in each of the first and second main surfaces of each of the first and second quartz crystal tuning fork tines; wherein the at least one groove formed in each of the first and second main surfaces of each of the first and second quartz crystal tuning fork tines comprises a third stepped portion opposite one of the first and second side surfaces of the corresponding one of the first and second quartz crystal tuning fork tines; wherein an electrode is disposed on the third stepped portion of the at least one groove formed in each of the first and second main surfaces of each of the first and second quartz crystal tuning fork tines so that a series resistance $R_1$ of a fundamental mode of vibration of the quartz crystal tuning fork resonator is less than a series resistance $R_2$ of a second overtone mode of vibration thereof; and wherein a spaced-apart distance between the first and second quartz crystal tuning fork tines is greater than or equal to a width of the at least one groove formed in each of the first and second main surfaces of each of the first and second quartz crystal tuning fork tines, the first stepped portion being connected to the second stepped portion through the third stepped portion.

3. An electronic apparatus according to claim 1; wherein the quartz crystal tuning fork base has a first portion having a first width $W_5$ and a second portion having a second width $W_6$ greater than or equal to the first width $W_5$; wherein two cut portions are formed between the first and second portions of the quartz crystal tuning fork base; wherein the at least one groove having the first and second stepped portions is formed in each of the first and second main surfaces of each of the first and second quartz crystal tuning fork tines; wherein the at least one groove formed in each of the first and second main surfaces of each of the first and second quartz crystal tuning fork tines comprises a third stepped portion opposite one of the first and second side surfaces of the corresponding one of the first and second quartz crystal tuning fork tines; and wherein an electrode is disposed on the third stepped portion of the at least one groove formed in each of the first and second main surfaces of each of the first and second quartz crystal tuning fork tines so that a capacitance ratio $r_1$ of a fundamental mode of vibration of the quartz crystal tuning fork resonator is less than a capacitance ratio $r_2$ of a second overtone mode of vibration thereof, the first stepped portion being connected to the second stepped portion through the third stepped portion.

4. An electronic apparatus according to claim 1; wherein the at least one quartz crystal oscillator comprises a first quartz crystal oscillator comprising a first quartz crystal oscillating circuit and a second quartz crystal oscillator comprising a second quartz crystal oscillating circuit, each of the first and second quartz crystal oscillating circuits having a quartz crystal resonator, an amplifier, at least one resistor, and a plurality of capacitors; wherein the quartz crystal resonator of the first quartz crystal oscillating circuit comprises one of a length-extensional mode quartz crystal resonator, a width-extensional mode quartz crystal resonator, a thickness shear mode quartz crystal resonator, a Lame mode quartz crystal resonator and a SAW resonator; and wherein the quartz crystal resonator of the second quartz crystal oscillating circuit comprises the quartz crystal tuning fork resonator having the first and second quartz crystal tuning fork tines connected to the quartz crystal tuning fork base.

5. An electronic apparatus according to claim 4; wherein each of the first and second main surfaces of each of the first and second quartz crystal tuning fork tines has a central linear portion; wherein the at least one groove is formed in the central linear portion of each of the first and second main surfaces of each of the first and second quartz crystal tuning fork tines so that a width of the at least one groove formed in the central linear portion of each of the first and second main surfaces of each of the first and second quartz crystal tuning fork tines is greater than a distance in the width direction of the at least one groove measured from an outer edge of the at least one groove to an outer edge of the corresponding one of the first and second quartz crystal tuning fork tines; wherein a length of the at least one groove formed in the central linear portion of each of the first and second main surfaces of each of the first and second quartz crystal tuning fork tines is within a range of 20% to 78% of an overall length of the quartz crystal tuning fork resonator; wherein the at least one groove having the first and second stepped portions formed in the central linear portion of each of the first and second main surfaces of each of the first and second quartz crystal tuning fork tines further comprises a third stepped portion opposite one of the first and second side surfaces of the corresponding one of the first and second quartz crystal tuning fork tines, the first and second quartz crystal tuning fork tines being formed before the at least one groove having the first, second and third stepped portions is formed; and wherein an electrode is disposed on the third stepped portion of the at least one groove formed in the central linear portion of each of the first and second main surfaces of each of the first and second quartz crystal tuning fork tines so that a capacitance ratio $r_1$ of a fundamental mode of vibration of the quartz crystal tuning fork resonator is less than a capacitance ratio $r_2$ of a second overtone mode of vibration thereof.

6. An electronic apparatus according to claim 4; further comprising a display portion; wherein the second quartz crystal oscillating circuit comprises an amplification circuit having a CMOS inverter, a feedback resistor, a negative resistance $-RL_1$ for a fundamental mode of vibration of the quartz crystal tuning fork resonator, and a negative resistance $-RL_2$ for a second overtone mode of vibration thereof; and a feedback circuit having the quartz crystal tuning fork resonator with a series resistance $R_1$ of the fundamental mode of vibration and a series resistance $R_2$ of the second overtone mode of vibration, a plurality of capacitors and a drain resistor, the quartz crystal tuning fork resonator being electrically connected to the CMOS inverter and the feedback resistor of the amplification circuit and to the capacitors and the drain resistor of the feedback circuit having the quartz crystal tuning fork resonator; and wherein a ratio $|-RL_1|/R_1$ is greater than $2|-RL_2|/R_2-1$, where $|-RL_1|$ represents an absolute value of the negative resistance for the fundamental mode of vibration of the quartz crystal tuning fork resonator of the amplification circuit and $|-RL_2|$ represents an absolute value of the negative resistance for the second overtone mode of vibration of the quartz crystal tuning fork resonator of the amplification circuit, an output signal of the second quartz crystal oscillating circuit comprising the quartz crystal tuning fork resonator having an oscillation frequency of the fundamental mode of vibration of about 32.768 kHz with a frequency deviation within a range of $-100$ PPM to $+100$ PPM and being a clock signal for use in operation of the electronic apparatus to display time information at the display portion.

7. An electronic apparatus according to claim 6; wherein the at least one groove having the first and second stepped portions formed in each of the first and second main surfaces of each of the first and second quartz crystal tuning fork tines further comprises a third stepped portion opposite one of the first and second side surfaces of the corresponding one of the first and second quartz crystal tuning fork tines; wherein the first stepped portion is connected to the second stepped portion through the third stepped portion, the first and second quartz crystal tuning fork tines being formed before the at least one groove having the first, second and third stepped portions is formed; and wherein an electrode is disposed on the third stepped portion of the at least one groove formed in each of the first and second main surfaces of each of the first and second quartz crystal tuning fork tines so that a capacitance ratio $r_1$ of the fundamental mode of vibration of the quartz crystal tuning fork resonator is less than a capacitance ratio $r_2$ of the second overtone mode of vibration thereof.

8. An electronic apparatus according to claim 1; wherein each of the first and second main surfaces of each of the first and second quartz crystal tuning fork tines has a central linear portion; wherein the at least one groove has a base portion and is formed in the central linear portion of each of the first and second main surfaces of each of the first and second quartz crystal tuning fork tines so that a width of the at least one groove formed in the central linear portion of each of the first and second main surfaces of each of the first and second quartz crystal tuning fork tines is greater than a distance in the width direction of the at least one groove measured from an outer edge of the at least one groove to an outer edge of the corresponding one of the first and second quartz crystal tuning fork tines; wherein a first electrode is disposed on the base portion of the at least one groove formed in the central linear portion of at least one of the first and second main surfaces of each of the first and second quartz crystal tuning fork tines; wherein a second electrode is disposed on each of the first and second side surfaces of each of the first and second quartz crystal tuning fork tines; wherein a third electrode is disposed on at least one of the first and second main surfaces of each of the first and second quartz crystal tuning fork tines; wherein the first electrode disposed on the base portion of the at least one groove formed in the central linear portion of the at least one of the first and second main surfaces of the first quartz crystal tuning fork tine is connected to the second electrode disposed on each of the first and second side surfaces of the second quartz crystal tuning fork tine and the third electrode disposed on the at least one of the first and second main surfaces of the first quartz crystal tuning fork tine; and wherein the first electrode disposed on the base portion of the at least one groove formed in the central linear portion of the at least one of the first and second main surfaces of the second quartz crystal tuning fork tine is connected to the second electrode disposed on each of the first and second side surfaces of the first quartz crystal tuning fork tine and the third electrode disposed on the at least one of the first and second main surfaces of the second quartz crystal tuning fork tine.

9. A method for manufacturing an electronic apparatus, comprising the steps of:

forming a quartz crystal tuning fork resonator capable of vibrating in a flexural mode of an inverse phase by etching a quartz crystal wafer to form a quartz crystal tuning fork base, and first and second quartz crystal tuning fork tines connected to the quartz crystal tuning fork base with each of the first and second quartz crystal tuning fork tines having a first main surface and a second main surface opposite the first main surface, and a first side surface and a second side surface opposite the first side surface, and etching the quartz crystal wafer to form at least one groove having a first stepped portion and a second stepped portion opposite the first stepped portion in the length direction in at least one of the first and second main surfaces of each of the first and second quartz crystal tuning fork tines, a length of the at least one groove formed in at least one of the first and second main surfaces of each of the first and second quartz crystal tuning fork tines being within a range of 20% to 78% of an overall length of the quartz crystal tuning fork resonator; and providing at least one quartz crystal oscillator comprised of a quartz crystal oscillating circuit having a quartz crystal resonator, an amplifier, at least one resistor, and a plurality of capacitors, the quartz crystal resonator comprising the quartz crystal tuning fork resonator having the first and second quartz crystal tuning fork tines, the quartz crystal tuning fork resonator having a cutting angle of ZYw(0° to 10°) and a piezoelectric constant $e_{12}$ within a range of 0.095 C/m² to 0.19 C/m² in the absolute value.

10. A method according to claim 9; wherein the at least one groove having the first and second stepped portions further comprises a third stepped portion opposite one of the first and second side surfaces of the corresponding one of the first and second quartz crystal tuning fork tines, the first stepped portion being connected to the second stepped portion through the third stepped portion; wherein the at least one groove having the first, second and third stepped portions is formed in each of the first and second main surfaces of each of the first and second quartz crystal tuning fork tines, the first and second quartz crystal tuning fork tines being formed before the at least one groove having the first, second and third stepped portions is formed; and wherein an electrode is disposed on the third stepped portion of the at least one groove formed in each of the first and second main surfaces of each of the first and second quartz crystal tuning fork tines so that a capacitance ratio $r_1$ of a fundamental mode of vibration of the quartz crystal tuning fork resonator is less than a capacitance ratio $r_2$ of a second overtone mode of vibration thereof.

11. A method according to claim 9; further including the steps of providing a case having a mounting portion and providing a lid for covering an open end of the case; and further comprising the sequential steps of forming the quartz crystal tuning fork base, and the first and second quartz crystal tuning fork tines in a first etching process so that a space-apart distance between the first and second quartz crystal tuning fork tines is within a range of 0.05 mm to 0.35 mm; forming a groove having a first stepped portion and a second stepped portion opposite the first stepped portion in the length direction in each of the first and second main surfaces of each of the first and second quartz crystal tuning fork tines in a second etching process different from the first etching process so that a width of the groove formed in each of the first and second main surfaces of each of the first and second quartz crystal tuning fork tines is less than or equal to the space-apart distance between the first and second quartz crystal tuning fork tines; disposing a first electrode on a surface of the groove formed in each of the first and second main surfaces of each of the first and second quartz crystal tuning fork tines and a second electrode on each of the first and second side surfaces of each of the first and second quartz crystal tuning fork tines so that a capacitance ratio $r_1$ of a fundamental mode of vibration of the quartz crystal tuning fork resonator is less than a capacitance ratio $r_2$ of a second overtone mode of vibration thereof; mounting the quartz crystal tuning fork resonator on the mounting portion of the case; connecting the lid to the case to cover the open end thereof; and electrically connecting the first electrode disposed on the surface of the groove formed in each of the first and second main surfaces of each of the first and second quartz crystal tuning fork tines and the second electrode disposed on each of the first and second side surfaces of each of the first and second quartz crystal tuning fork tines to the amplifier, the at least one resistor and the capacitors of the quartz crystal oscillating circuit comprising the quartz crystal tuning fork resonator.

12. A method according to claim 11; further comprising the step of adjusting an oscillation frequency of the quartz crystal tuning fork resonator having the first and second quartz crystal tuning fork tines each including the groove having the first and second stepped portions after the step of mounting the quartz crystal tuning fork resonator on the mounting portion of the case and before the step of connecting the lid to the case to cover the open end thereof; wherein the connecting step of the lid and the case includes the step of connecting the lid to the case to cover the open end thereof in a vacuum; wherein the at least one quartz crystal oscillator comprises a first quartz crystal oscillator comprised of a first quartz crystal oscillating circuit having the quartz crystal tuning fork resonator, an amplifier, at least one resistor, and a plurality of capacitors, the quartz crystal tuning fork resonator being electrically connected to the amplifier, the at least one resistor and the capacitors of the first quartz crystal oscillating circuit comprising the quartz crystal tuning fork resonator, and an output signal of the first quartz crystal oscillating circuit comprising the quartz crystal tuning fork resonator being a clock signal for use in operation of the electronic apparatus to display time information at a display portion, the clock signal having an oscillation frequency of the fundamental mode of vibration of the quartz crystal tuning fork resonator.

13. A method according to claim 12; further including the step of providing a CPU; wherein the at least one quartz crystal oscillator further comprises a second quartz crystal oscillator comprised of a second quartz crystal oscillating circuit having a thickness shear mode quartz crystal resonator, an amplifier, at least one resistor, and a plurality of capacitors, an output signal of the second quartz crystal oscillating circuit comprising the thickness shear mode quartz crystal resonator being a clock signal for use in operation of the electronic apparatus to operate the CPU.

14. A method according to claim 11; wherein the case has a through hole; and further comprising the steps of adjusting in a vacuum an oscillation frequency of the quartz crystal tuning fork resonator having the first and second quartz crystal tuning fork tines each including the groove having the first and second stepped portions and disposing a metal into the through hole of the case the adjusting step of the oscillation frequency in the vacuum being performed after the connecting step of the lid and the case and before the disposing step of the metal; wherein the at least one quartz crystal oscillator comprises a first quartz crystal oscillator comprised of a first quartz crystal oscillating circuit having the quartz crystal tuning fork resonator, an amplifier, at least one resistor, and a plurality of capacitors, the quartz crystal tuning fork resonator being electrically connected to the amplifier, the at least one resistor and the capacitors of the first quartz crystal oscillating circuit comprising the quartz crystal tuning fork resonator, and an output signal of the first quartz crystal oscillating circuit comprising the quartz crystal tuning fork resonator being a clock signal for use in operation of the electronic apparatus to display time information at a display portion, the clock signal having an oscillation frequency of the fundamental mode of vibration of the quartz crystal tuning fork resonator.

15. A method according to claim 14; further including the step of providing a CPU; wherein the at least one quartz crystal oscillator further comprises a second quartz crystal oscillator comprised of a second quartz crystal oscillating circuit having a thickness shear mode quartz crystal resonator, an amplifier, at least one resistor, and a plurality of capacitors, an output signal of the second quartz crystal oscillating circuit comprising the thickness shear mode quartz crystal resonator being a clock signal for use in operation of the electronic apparatus to operate the CPU.

16. A method according to claim 9; further including the step of providing a display portion; wherein the at least one quartz crystal oscillator comprises a first quartz crystal oscillator comprising a first quartz crystal oscillating circuit and a second quartz crystal oscillator comprising a second quartz crystal oscillating circuit, each of the first and second quartz crystal oscillating circuits having a quartz crystal resonator, an amplifier, at least one resistor, and a plurality of capacitors; wherein the quartz crystal resonator of the first quartz crystal oscillating circuit comprises one of a length-extensional mode quartz crystal resonator, a width-extensional mode quartz crystal resonator, a thickness shear mode quartz crystal resonator, a Lame mode quartz crystal resonator and a SAW resonator; wherein the quartz crystal resonator of the second quartz crystal oscillating circuit comprises the quartz crystal tuning fork resonator having the first and second quartz crystal tuning fork tines each including the at least one groove having the first and second stepped portions, the first and second quartz crystal tuning fork tines being formed before the at least one groove having the first and second stepped portions is formed; and further comprising the steps of providing an amplification circuit having a CMOS inverter, a feedback resistor, a negative resistance $-RL_1$ for a fundamental mode of vibration of the quartz crystal tuning fork resonator, and a negative resistance $-RL_2$ for a second overtone mode of vibration thereof; providing a feedback circuit having the quartz crystal tuning fork resonator with a series resistance $R_1$ of the fundamental mode of vibration and a series resistance $R_2$ of the second overtone mode of vibration, a plurality of capacitors and a drain resistor; and electrically connecting the quartz crystal tuning fork resonator to the CMOS inverter and the feedback resistor of the amplification circuit and to the capacitors and the drain resistor of the feedback circuit having the quartz crystal tuning fork resonator; and wherein a ratio $|-RL_1|/R_1$ is greater than $2|-RL_2|/R_2-1$, where $|-RL_1|$ represents an absolute value of the negative resistance for the fundamental mode of vibration of quartz crystal tuning fork resonator of the amplification circuit and $|-RL_2|$ represents an absolute value of the negative resistance for the second overtone mode of vibration of the quartz crystal tuning fork resonator of the amplification circuit, an output signal of the second quartz crystal oscillating circuit comprising the quartz crystal tuning fork resonator having an oscillation frequency of the fundamental mode of vibration of about 32.768 kHz with a frequency deviation within a range of −100 PPM to +100 PPM and being a clock signal for use in operation of the electronic apparatus to display time information at the display portion.

17. A method for manufacturing a quartz crystal unit comprising a quartz crystal resonator, comprising the steps of:
forming a quartz crystal tuning fork resonator capable of vibrating in a flexural mode of an inverse phase by etching a quartz crystal wafer to form a quartz crystal tuning fork base, and first and second quartz crystal tuning fork tines connected to the quartz crystal tuning fork base with each of the first and second quartz crystal tuning fork tines having a first main surface and a second main surface opposite the first main surface, and a first side surface and a second side surface opposite the first side surface, and etching the quartz crystal wafer to form at least one groove having a first stepped portion and a second stepped portion opposite the first stepped portion in the length direction in at least one of the first and second main surfaces of each of the first and second quartz crystal tuning fork tines, a length of the at least one groove formed in at least one of the first and second main surfaces of each of the first and second quartz crystal tuning fork tines being within a range of 20% to 78% of an overall length of the quartz crystal tuning fork resonator; wherein the quartz crystal resonator comprises the quartz crystal tuning fork resonator, the quartz crystal tuning fork resonator having a cutting angle of ZYw(0° to 10°)and a piezoelectric constant $e_{12}$ within a range of 0.095 C/m² to 0.19 C/m² in the absolute value.

18. A method according to claim 17; wherein the quartz crystal wafer comprises a first surface and a second surface opposite the first surface; and further including the steps of providing a case having a mounting portion and providing a lid for covering an open end of the case; and further comprising the sequential steps of disposing a first metal film on each of the first and second surfaces of the quartz crystal wafer and a first resist on the first metal film; forming the quartz crystal tuning fork base, and the first and second quartz crystal tuning fork tines in a first etching process so that a space-apart distance between the first and second quartz crystal tuning fork tines is within a range of 0.05 mm to 0.35 mm; forming the at least one groove having the first stepped portion and the second stepped portion opposite the first stepped portion in the length direction in each of the first and second main surfaces of each of the first and second quartz crystal tuning fork tines in a second etching process different from the first etching process so that a width of the at least one of the at least one groove formed in each of the first and second main surfaces of each of the first and second quartz crystal tuning fork tines is less than or equal to the space-apart distance between the first and second quartz crystal tuning fork tines; disposing a second metal film on each of the first and second main surfaces and the first and second side surfaces, and a surface of the at least one groove formed in each of the first and second main surfaces of each of the first and second quartz crystal tuning fork tines and a second resist on the second metal film; forming a first electrode on the surface of the at least one groove formed in each of the first and second main surfaces of each of the first and second quartz crystal tuning fork tines and a second electrode on each of the first and second side surfaces of each of the first and second quartz crystal tuning fork tines so that the first electrode disposed on the surface of the at least one groove formed in each of the first and second main surfaces of the first quartz crystal tuning fork tine is connected to the second electrode disposed on each of the first and second side surfaces of the second quartz crystal tuning fork tine and the first electrode disposed on the surface of the at least one groove formed in each of the first and second main surfaces of the second quartz crystal tuning fork tine is connected to the second electrode disposed on each of the first and second side surfaces of the first quartz crystal tuning fork tine, and a capacitance ratio $r_1$ of a fundamental mode of vibration of the quartz crystal tuning fork resonator is less than a capacitance ratio $r_2$ of a second overtone mode of vibration thereof; mounting the quartz crystal tuning fork resonator on the mounting portion of the case; adjusting an oscillation frequency of the quartz crystal tuning fork resonator; and connecting the lid to the case to cover the open end thereof.

19. A method according to claim 18; further comprising the step of removing the first resist disposed on the first metal film before the disposing step of the second metal film; wherein the step of adjusting an oscillation frequency of the quartz crystal tuning fork resonator includes the step of adjusting the oscillation frequency of the quartz crystal tuning fork resonator so that the oscillation frequency thereof is about 32.768 kHz with a frequency deviation within a range of −100 PPM to +100 PPM; wherein the lid has a metal and the case has ceramics; and wherein the step of connecting the lid to the case to cover the open end thereof includes the step of connecting the lid of the metal to the case of the ceramics through a metal to cover the open end thereof in a vacuum.

20. A method according to claim 17; wherein the quartz crystal wafer comprises a first surface and a second surface opposite the first surface; and further including the steps of providing a case having a mounting portion and a through hole; and providing a lid for covering an open end of the case; and further comprising the sequential steps of disposing a first metal film on each of the first and second surfaces of the quartz crystal wafer and a first resist on the first metal film; forming the quartz crystal tuning fork base, and the first and second quartz crystal tuning fork tines in a fist etching process so that a space-apart distance between the first and second quartz crystal tuning fork tines is within a range of 0.05 mm to 0.35 mm; forming the at least one groove having the first stepped portion and the second stepped portion opposite the first stepped portion in the length direction in each of the first and second main surfaces of each of the first and second quartz crystal tuning fork tines in a second etching process different from the first etching process so that a width of the at least one groove formed in each of the first and second main surfaces of each of the first and second quartz crystal tuning fork tines is less than or equal to the space-apart distance between the first and second quartz crystal tuning fork tines; disposing a second metal film on each of the first and second main surfaces and the first and second side surfaces, and a surface of the at least one groove formed in each of the first and second main surfaces of each of the first and second quartz crystal tuning fork tines and a second resist on the second metal film; forming a first electrode on the surface of the at least one groove formed in each of the first and second main surfaces of each of the first and second quartz crystal tuning fork tines and a second electrode on each of the first and second side surfaces of each of the first and second quartz crystal tuning fork tines so that the first electrode disposed on the surface of the at least one groove formed in each of the first and second main surfaces of the first quartz crystal tuning fork tine is connected to the second electrode disposed on each of the first and second side surfaces of the second quartz crystal tuning fork tine and the first electrode disposed on the surface of the at least one groove formed in each of the first and second main surfaces of the second quartz crystal tuning fork tine is connected to the second electrode disposed on each of the first and second side surfaces of the first quartz crystal tuning fork tine, and a capacitance ratio $r_1$ of a fundamental mode of vibration of the quartz crystal tuning fork resonator is less than a capacitance ratio $r_2$ of a second overtone mode of vibration thereof; mounting the quartz crystal tuning fork resonator on the mounting portion of the case; connecting the lid to the case to cover the open end thereof; adjusting in a vacuum an oscillation frequency of the quartz crystal tuning fork resonator; and disposing a metal 21. A method according to claim 20; further comprising the step of removing the second resist disposed on the second metal film before the mounting step; wherein the lid has a glass and the case has ceramics; and wherein the step of connecting the lid to the case to cover the open end thereof includes the step of connecting the lid of the glass to the case of the ceramics through a glass with a low melting point.

22. A method according to claim 20; further comprising the step of removing the second resist disposed on the second metal film before the mounting step; wherein the lid has a metal and a glass, and the case has ceramics; and wherein the step of connecting the lid to the case to cover the open end thereof includes the step of connecting the lid of the metal and the glass to the case of the ceramics through a metal.

23. A method according to claim 20; wherein the step of adjusting in a vacuum an oscillation frequency of the quartz crystal tuning fork resonator includes the step of adjusting in the vacuum the oscillation frequency of the quartz crystal tuning fork resonator so that the oscillation frequency thereof is about 32.768 kHz with a frequency deviation within a range of −100 PPM to +100 PPM; and wherein the step of disposing a metal into the through hole of the case includes the step of disposing the metal into the through hole of the case in a vacuum.

24. A method according to claim 17; further including the steps of providing a ease having a mounting portion and a through hole; and providing a lid for covering an open end of the case; wherein the lid has a glass; and further comprising the sequential steps of forming the quartz crystal tuning fork base, and the first and second quartz crystal tuning fork tines each not having a through hole extending from the first main surface to the second main surface in a first etching process, forming the at least one groove having the first stepped portion and the second stepped portion opposite the first stepped portion in the length direction in each of the first and second main surfaces of each of the first and second quartz crystal tuning fork tines in a second etching process different from the first etching process so that a width of the at least one groove formed in each of the first and second main surfaces of each of the first and second quartz crystal tuning fork tines is less than or equal to a space-apart distance between the first and second quartz crystal tuning fork tines, the first stepped portion being connected to the second stepped portion through a third stepped portion; disposing a first electrode on a surface of the at least one groove formed in each of the first and second main surfaces of each of the first and second quartz crystal tuning fork tines and a second electrode on each of the first and second side surfaces of each of the first and second quartz crystal tuning fork tines so that a capacitance ratio $r_1$ of a fundamental mode of vibration of the quartz crystal tuning fork resonator is less than a capacitance ratio $r_2$ of a second overtone mode of vibration thereof; mounting the quartz crystal tuning fork resonator on the mounting portion of the case; connecting the lid of the glass to the case through a glass with a low melting point to cover the open end thereof; adjusting in a vacuum an oscillation frequency of the quartz crystal tuning fork resonator so that the oscillation frequency thereof is about 32.768 kHz with a frequency deviation within a range of −100 PPM to +100 PPM; and disposing a metal into the through hole of the case in a vacuum.

25. A method according to claim 17; wherein each of the first and second main surfaces of each of the first and second quartz crystal tuning fork tines has a central linear portion; wherein the at least one groove has a base portion and is formed in the central linear portion of each of the first and second main surfaces of each of the first and second quartz crystal tuning fork tines so that a width of the at least one groove formed in the central linear portion of each of the first and second main surfaces of each of the first and second quartz crystal tuning fork tines is greater than a distance in the width direction of the at least one groove measured from an outer edge of the at least one groove to an outer edge of the corresponding one of the first and second quartz crystal tuning fork tines; and further comprising the step of disposing a first electrode on the base portion of the at least one groove formed in the central linear portion of at least one of the first and second main surfaces of each of the first and second quartz crystal tuning fork tines and a second electrode on each of the first and second side surfaces of each of the first and second quartz crystal tuning fork tines; wherein a third electrode is disposed on at least one of the first and second main surfaces of each of the first and second quartz crystal tuning fork tines; and further comprising the steps of connecting the first electrode disposed on the base portion of the at least one groove formed in the central linear portion of the at least one of the first and second main surfaces of the first quartz crystal tuning fork tine to the second electrode disposed on each of the first and second side surfaces of the second quartz crystal tuning fork tine and the third electrode disposed on the at least one of the first and second main surfaces of the first quartz crystal tuning fork tine, and connecting the first electrode disposed on the base portion of the at least one groove formed in the central linear portion of the at least one of the first and second main surfaces of the second quartz crystal tuning fork tine to the second electrode disposed on each of the first and second side surfaces of the first quartz crystal tuning fork tine and the third electrode disposed on the at least one of the first and second main surfaces of the second quartz crystal tuning fork tine.

26. A method according to claim 17; further including the steps of providing a case having a mounting portion and a through hole; and providing a lid for covering an open end of the case; wherein the lid has a metal and the case has ceramics; wherein the quartz crystal wafer comprises a first surface and a second surface opposite the first surface; and further comprising the sequential steps of disposing a first metal film on each of the first and second surfaces of the quartz crystal wafer and a first resist on the first metal film; forming the quartz crystal tuning fork base, and the first and second quartz crystal tuning fork tines in a first etching process so that a spaced apart distance between the first and second quartz crystal tuning fork tines is within a range of 0.05 mm to 0.35 mm; forming a groove having a first stepped portion and a second stepped portion opposite the first stepped portion in the length direction in each of the first and second main surfaces of each of the first and second quartz crystal tuning fork tines in a second etching process different from the first etching process so that a width of the groove formed in each of the first and second main surfaces of each of the first and second quartz crystal tuning fork tines is less than or equal to the space-apart distance between the first and second quartz crystal tuning fork tines; disposing a second metal film on each of the first and second main surfaces and the first and second side surfaces, and a surface of the groove formed in each of the first and second main surfaces of each of the first and second quartz crystal tuning fork tines and a second resist on the second metal film; forming a first electrode on the surface of the groove formed in each of the first and second main surfaces of each of the first and second quartz crystal tuning fork tines and a second electrode on each of the first and second side surfaces of each of the first and second quartz crystal tuning fork tines so that the first electrode disposed on the surface of the groove formed in each of the first and second main surfaces of the first quartz crystal tuning fork tine is connected to the second electrode disposed on each of the first and second side surfaces of the second quartz crystal tuning fork tine and the first electrode disposed on the surface of the groove formed in each of the first and second main surfaces of the second quartz crystal tuning fork tine is connected to the second electrode disposed on each of the first and second side surfaces of the first quartz crystal tuning fork tine; removing the second resist disposed on the second metal film; mounting the quartz crystal tuning fork resonator on the mounting portion of the case; adjusting an oscillation frequency of the quartz crystal tuning fork resonator so that the oscillation frequency thereof is about 32.768 kHz with a frequency deviation within a range of −100 PPM to +100 PPM; connecting the lid of the metal to the case of the ceramics through a metal to cover the open end thereof; and disposing a metal into the through hole of the case in a vacuum.

27. A method according to claim 26; further including the steps of removing the first resist and the first metal film before the disposing step of the second metal film and adjusting in the quartz crystal wafer the oscillation frequency of the quartz crystal tuning fork resonator by a laser method or an evaporation method or an ion etching method before the mounting step so that the oscillation frequency thereof has a preselected oscillation frequency; wherein the preselected oscillation frequency is about 32.768 kHz with a frequency deviation within a range of −9000 PPM to +5000 PPM.

28. A method according to claim 17; further including the steps of providing a case having a mounting portion and a through hole; and providing a lid for covering an open end of the case; wherein the lid is made of glass; and further comprising the sequential steps of mounting the quartz crystal tuning fork resonator on the mounting portion of the case; connecting the glass lid to the case through a glass with a low melting point to cover the open end thereof adjusting in a vacuum an oscillation frequency of the quartz crystal tuning fork resonator so that the oscillation frequency thereof is about 32.768 kHz with a frequency deviation within a range of −100 PPM to +100 PPM; and disposing a metal into the through hole of the case in a vacuum.

29. A method according to claim 17; further including the steps of providing a case having a mounting portion and a through hole; and providing a lid for covering an open end of the case; wherein the lid is made of a glass and a metal; and further comprising the sequential steps of mounting the quartz crystal tuning fork resonator on the mounting portion of the case; connecting the metal of the lid to the case through a metal to cover the open end thereof; adjusting in a vacuum an oscillation frequency of the quartz crystal tuning fork resonator so that the oscillation frequency thereof is about 32.768 kHz with a frequency deviation within a range of −100 PPM to +100 PPM; and disposing a metal into the through hole of the case in a vacuum.

30. A method according to claim 17; further including the steps of providing a case having a mounting portion and a through hole; and providing a lid for covering an open end of the case; wherein the lid is made of metal; and further comprising the sequential steps of mounting the quartz crystal tuning fork resonator on the mounting portion of the case; adjusting an oscillation frequency of the quartz crystal tuning fork resonator so that the oscillation frequency thereof is about 32.768 kHz with a frequency deviation within a range of −100 PPM to +100 PPM; connecting the metal lid to the case through a metal to cover the open end thereof; and disposing a metal into the through hole of the case in a vacuum.

31. A method according to claim 17; further including the steps of providing a case having a mounting portion; and providing a lid for covering an open end of the case; wherein the lid is made of metal; and further comprising the sequential steps of mounting the quartz crystal tuning fork resonator on the mounting portion of the case; adjusting an oscillation frequency of the quartz crystal tuning fork resonator so that the oscillation frequency thereof is about 32.768 kHz with a frequency deviation within a range of −100 PPM to +100 PPM; and connecting the metal lid to the case through a metal to cover the open end thereof in a vacuum.

* * * * *